(12) United States Patent
    Bryant

(10) Patent No.: US 11,025,243 B2
(45) Date of Patent: Jun. 1, 2021

(54) POWER CIRCUIT

(71) Applicant: Maschinenfabrik Reinhausen GmbH, Regensburg (DE)

(72) Inventor: Angus Bryant, Cambridge (GB)

(73) Assignee: MASCHINENFABRIK REINHAUSEN GMBH, Regensburg (DE)

( * ) Notice: Subject to any disclaimer, the term of this patent is extended or adjusted under 35 U.S.C. 154(b) by 306 days.

(21) Appl. No.: 16/095,698

(22) PCT Filed: Apr. 24, 2017

(86) PCT No.: PCT/EP2017/059587
§ 371 (c)(1),
(2) Date: Oct. 23, 2018

(87) PCT Pub. No.: WO2017/186609
PCT Pub. Date: Nov. 2, 2017

(65) Prior Publication Data
US 2019/0131964 A1    May 2, 2019

(30) Foreign Application Priority Data

Apr. 28, 2016    (GB) ..................................... 1607373

(51) Int. Cl.
*H03K 17/082*    (2006.01)
*H03K 17/18*    (2006.01)
(Continued)

(52) U.S. Cl.
CPC ........... *H03K 17/082* (2013.01); *H03K 17/18* (2013.01); *H03K 17/74* (2013.01); *H03K 2017/0806* (2013.01); *H03K 2217/0027* (2013.01)

(58) Field of Classification Search
CPC ...... H03K 17/082; H03K 17/18; H03K 17/74; H03K 2017/0806; H03K 2217/0027;
(Continued)

(56) References Cited

U.S. PATENT DOCUMENTS 3,845,405 A    10/1974    Leidich
5,444,591 A    8/1995    Chokhawala et al.
(Continued)

FOREIGN PATENT DOCUMENTS

DE    4410978 A1    10/1994
DE    102015108412 A1    12/2015
(Continued)

*Primary Examiner* — Kyle J Moody
(74) *Attorney, Agent, or Firm* — Leydig, Voit & Mayer, Ltd.

(57) ABSTRACT

A power circuit has a power switching device (PSD) to, when in an ON state, conduct current from its first to second terminal; a diode anti-parallel to the PSD that, when in a non-blocking state, conducts current from its anode to its cathode; a drive input line coupled to a device control terminal of the PSD to control its switching; and sense circuitry, having a temperature sensitive current source (TSCS) coupled to a conduction terminal, providing a sense signal from the TSCS to the drive input line to indicate temperature. The TSCS is thermally coupled to the PSD, the temperature indicated is of the PSD, and the conduction terminal is the first or second terminal of the PSD; and/or the TSCS is thermally coupled to the diode, the temperature indicated by the sense signal is of the diode, and the conduction terminal is the anode or cathode of the diode.

28 Claims, 18 Drawing Sheets

(51) Int. Cl.
*H03K 17/74* (2006.01)
*H03K 17/08* (2006.01)

(58) Field of Classification Search
CPC ...... H03K 17/0828; G01K 7/01; G08C 19/02; G08C 19/04; H01L 23/34
See application file for complete search history.

(56) References Cited

U.S. PATENT DOCUMENTS

| | | | |
|---|---|---|---|
| 5,559,656 A * | 9/1996 | Chokhawala | H03K 17/0828 361/18 |
| 6,633,473 B1 * | 10/2003 | Tomomatsu | H01L 29/7395 361/93.7 |
| 8,072,241 B2 * | 12/2011 | Kouno | H01L 27/0255 326/61 |
| 8,155,916 B2 | 4/2012 | Baginski et al. | |
| 10,432,186 B2 * | 10/2019 | Yang | H02M 3/155 |
| 2005/0019635 A1 | 1/2005 | Arroyo et al. | |
| 2014/0300278 A1 * | 10/2014 | Van Bodegraven | H05B 45/48 315/153 |
| 2015/0346037 A1 * | 12/2015 | Kiep | H01L 35/34 374/178 |
| 2016/0011058 A1 * | 1/2016 | Kiep | G01K 7/01 374/178 |
| 2016/0231358 A1 | 8/2016 | Wasekura | |
| 2019/0273488 A1 * | 9/2019 | Reiter | H03K 17/08104 |
| 2020/0195246 A1 * | 6/2020 | Randolph | H03K 17/063 |

FOREIGN PATENT DOCUMENTS

| | | |
|---|---|---|
| EP | 2565608 A1 | 3/2013 |
| GB | 2253709 A | 9/1992 |
| GB | 2267003 A | 11/1993 |
| JP | 2007095848 A | 4/2007 |
| JP | 2012019550 A | 1/2012 |
| WO | WO 2015064206 A1 | 7/2015 |

* cited by examiner

POWER CIRCUIT

CROSS-REFERENCE TO PRIOR APPLICATIONS

This application is a U.S. National Stage Application under 35 U.S.C. § 371 of International Application No. PCT/EP2017/059587 filed on Apr. 24, 2017, and claims benefit to British Patent Application No. GB 1607373.6 filed on Apr. 28, 2016. The International Application was published in English on Nov. 2, 2017, as WO 2017/186609 A1 under PCT Article 21(2).

FIELD

The present invention generally relates to power circuits, a multi-chip module having at least one such power circuit, and drive circuitry for driving a power switching device of a power circuit.

BACKGROUND

Power semiconductor devices are widely in use for a large range of power applications. Low power applications include power supplies, e.g. for electronic circuits and computers, and small motor drives. Medium power applications (greater than a few kW) include large motor drives—for example electric vehicles, rail traction, large industrial drives, wind turbines and/or marine drives—and solar converters. High power applications include high voltage dc transmission lines of the type which may, for example, carry power from an offshore wind installation.

The power semiconductor switching devices with which we are concerned typically have a current carrying capability of greater than 1 A and are operable with a voltage of greater than 100 V. Embodiments of the devices are typically, but not exclusively, able to carry currents of between 10 and 100 A per device chip and/or are able to sustain a voltage difference across the device of greater than 500 V.

Examples of such devices include insulated gate bipolar transistors (IGBTs), as well as FETs such as vertical or lateral metal oxide semiconductor field effect transistors (MOSFETS). The techniques we will describe are not limited to any particular type of device architecture and thus the power switching devices may be, for example, either vertical or lateral devices; they may be fabricated in a range of technologies including, but not limited to, silicon, and silicon carbide.

In most circuits, freewheeling diodes—often also denoted as flywheel diodes—need to be used in relation with the power semiconductor switching devices such as IGBTs (insulated gate bipolar transistors) or MOSFETs (metal oxide semiconductor field effect transistors) for a continuous load current conduction to avoid large voltage damaging the semiconductor devices and the circuit. High power IGBTs are often supplied as a module with diodes that act as freewheel diodes within the module. IGBTs are typically each found in parallel (specifically, in anti-parallel) with a freewheeling diode.

It may be desirable to obtain advance warning of failure in order to allow for preventative or prompt remedial action. In this regard, device failure may be caused by factors such as high device junction temperature or high device currents. Because the voltages/currents at which the device is being switched are large, there is a significant risk of device failure. In many applications, tens of devices may typically be connected in parallel to operate at the desired currents. In this case, when one device in such a system fails, other switching devices in the system can easily fail as a consequence, although this depends on the topology of the power converter.

EP 256 56 08 A1 describes a semiconductor device designed as a chip with a first and a second output and a gate including a temperature dependant ohmic resistance in order to measure the temperature of the chip, wherein the temperature-dependant resistor has an electrical connection between the gate and the first or second output and a thermal contact with the chip.

In US 2005 019 635 A1 a semiconductor component is proposed in which a control resistance element (NTC) is provided in electrical contact between a control region (G) for setting operating properties and a first input/output region (S). The control resistance element (NTC) having an operating temperature range in which the nonreactive resistance falls monotonically as the operating temperature increases. The central idea is to form a control resistor or a control resistance element between the control region and the first input/output region of the semiconductor component. This has the effect of modulating the potential difference between the control region and the first input/output region in the manner of a voltage divider, this modulation being effected on account of the temperature dependence of the control resistance element.

GB 22 53 709 A discloses a overcurrent detection circuit in order to detect an overcurrent condition of the main current I in a power semiconductor device having a current mirror element in parallel which consists of a constant current device connected between a current mirror terminal and a main terminal to keep the shunt current constant, and a determining pan to output an overcurrent detection signal based on the difference between the inter-terminal potential difference and a predetermined threshold voltage. The constant current device may use a MOSFET, and may be integrated on one chip with a power semiconductor device.

GB 22 67 003 A discloses a current-limiting circuit in which a first main terminal and control terminals are used in common for a main semiconductor element by the output of an operational amplifier generated by a comparison, with a reference voltage of the voltage between both terminals of a current detection element which is connected between the second main terminal of a current mirror element and the second main terminal of the main semiconductor element, and through which a current proportional to the output current flowing across the first main terminal and the second main terminal of the main semiconductor element flows, wherein a reference voltage is applied to the first input terminal of the operational amplifier a first gain adjusting element is connected between the second input terminal and the second main terminal of the current mirror element, and a second adjusting element that has an impedance at a predetermined magnification against an impedance of the first gain adjusting element is connected between the control terminals of the main semiconductor element.

U.S. Pat. No. 3,845,405 describes an embodiment in which the base-emitter junction of a power transistor and an auxiliary transistor are paralleled. The smaller collector current of the auxiliary transistor can be sampled so as to indirectly sample the larger collector current of the power transistor. When the indirect sampling indicates that the collector current in the power transistor is tending to exceed its rated maximum value, its base and emitter electrodes are clamped.

U.S. Pat. No. 8,155,916 B provides a circuit arrangement integrated in a semiconductor body. A resistance component is thermally coupled to the power semiconductor component and likewise integrated into the semiconductor body and arranged between the control connection and the load connection of the power semiconductor component. The resistance component has a temperature-dependant resistance characteristic curve. A driving and evaluation unit is designed to evaluate the current through the resistance component or the voltage drop across the resistance component and provides a temperature signal dependant thereon.

On-chip junction temperature measurement for an IGBT device has, until now, been achieved using a temperature sense diode integrated on to the device chip itself. Such a sense diode is connected to the gate drive using separate connections. These have been developed by many device manufacturers, and may be offered in low-current intelligent power modules (IPMs) with one device chip per switch (typically <100 A rating). Applying them in conventional power device module packages is difficult, partly because of the large number of parallel die per switch, and also because of the extra connections required between the gate drive and module.

Regarding current sensing, direct current sensing may be feasible for IGBT chips using an auxiliary emitter cell (carrying a small proportion of the device current), with a temperature sense resistor placed in series with the cell. Again, this however requires a separate connection to output the sense signal, for example back to the gate drive that controls the voltage on the IGBT gate. This makes such sensing infeasible for multi-chip power modules.

Thus, power device current and temperature sensing may be implemented using extra sense elements integrated into device chips, e.g. temperature sense diodes and current sense cells. These sense elements may be used in single-chip devices, e.g. IPMs, but cannot be utilised in high power multi-chip device modules because of the large number of sensitive connections required to the gate drive. While it may be possible to estimate junction temperature and device current from the gate drive using complex algorithms and difficult-to-measure electrical behavioural parameters, circuits using such sense elements would nevertheless have challenges in practical implementation, including calibration.

SUMMARY

According to an embodiment, a power circuit has a power switching device configured to, when in an ON state, conduct current from a first device conduction terminal of the power switching device to a second device conduction terminal of the power switching device; a freewheel diode coupled in anti-parallel to the power switching device, the freewheel diode being configured to, when in a non-blocking state, conduct current from an anode conduction terminal of the freewheel diode to a cathode conduction terminal of the freewheel diode; a drive input line coupled to a device control terminal of the power switching device to control switching of the power switching device; and sense circuitry having at least one temperature sensitive current source coupled to at least one of conduction terminals, the sense circuitry configured to provide at least one sense signal from the temperature sensitive current source to the drive input line, the sense signal configured to indicate at least one temperature. At least one of: the temperature sensitive current source is thermally coupled to the power switching device, the temperature indicated by the sense signal is of the power switching device, and the at least one of the conduction terminals is the first device conduction terminal or the second device conduction terminal of the power switching device; and the temperature sensitive current source is thermally coupled to the freewheel diode, the temperature indicated by the sense signal is of the freewheel diode, and the at least one of the conduction terminals is the anode conduction terminal or the cathode conduction terminal of the freewheel diode.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIG. 2(b) shows an example power circuit having an IGBT temperature sense resistor;

DETAILED DESCRIPTION

Figure 1:
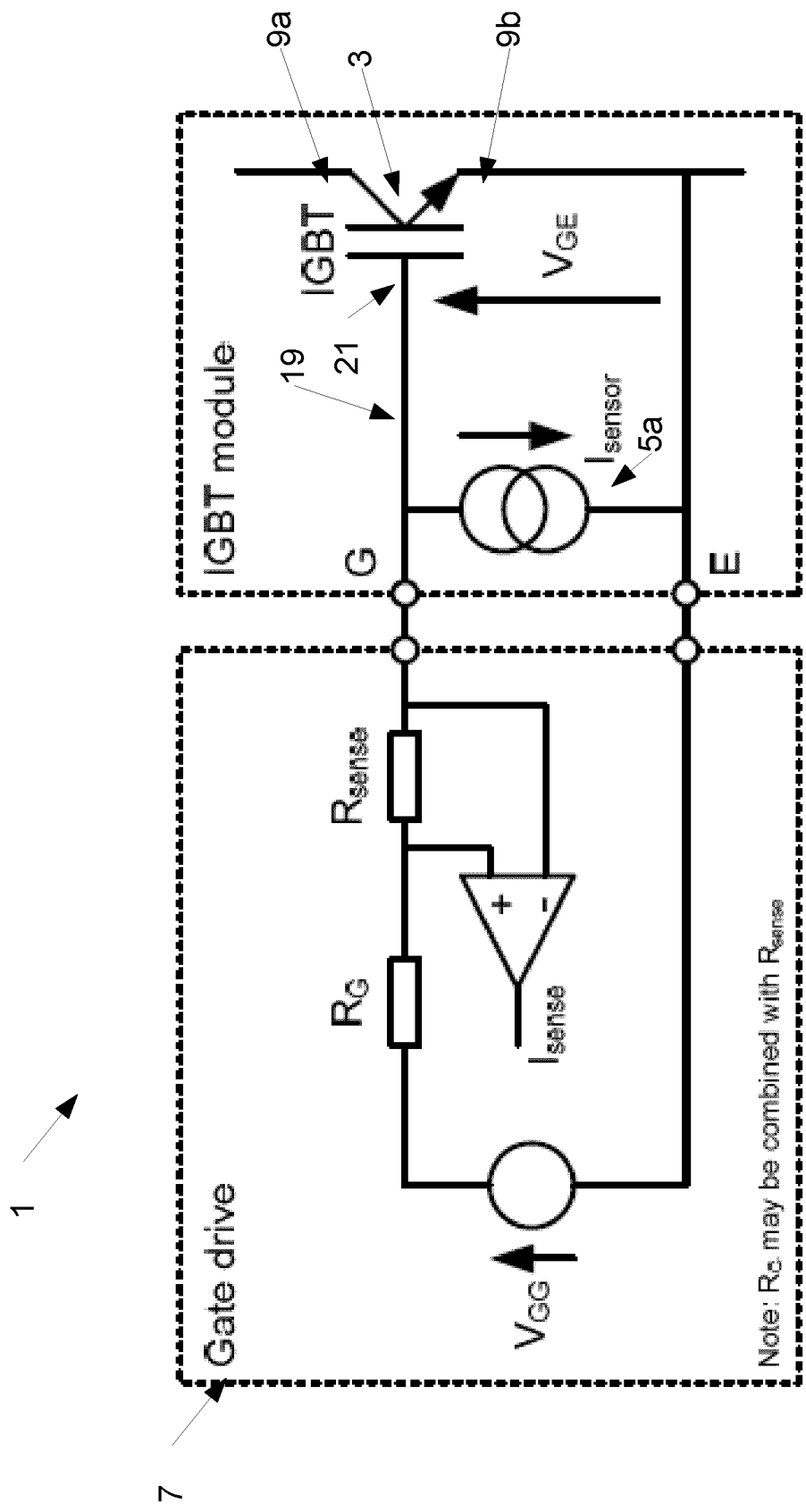
FIG. 1 shows a principle of operation of an embodiment, using current to measure device behaviour.

According to a first aspect of the present invention, there is provided a power circuit including: a power switching device to, when in an ON state, conduct current from a first device conduction terminal of the device to a second device conduction terminal of the device; and a freewheel diode coupled in anti-parallel to the power switching device, the freewheel diode to, when in a non-blocking state, conduct current from an anode conduction terminal of the freewheel diode to a cathode conduction terminal of the freewheel diode; and a drive input line coupled to a device control terminal of the power switching device to control switching of the power switching device, wherein the power circuit includes: sense circuitry including at least one temperature sensitive current source coupled to at least one the conduction terminal, the sense circuitry to provide at least one sense signal from the temperature sensitive current source to the drive input line, the sense signal to indicate at least one temperature, wherein at least one of: the temperature sensitive current source is thermally coupled to the power switching device, the temperature indicated by the sense signal is of the power switching device, and the at least one the conduction terminal includes the device conduction terminal of the power switching device; and the temperature sensitive current source is thermally coupled to the freewheel diode, the temperature indicated by the sense signal is of the freewheel diode, and the at least one the conduction terminal includes the anode or cathode conduction terminal of the freewheel diode.

Embodiments of the present invention may thus provide improved monitoring of power device circuits, for example monitoring of a power semiconductor switching device and/or a power diode (e.g., freewheel diode), for example to warn of impending failure. Specific advantages of embodiments may be for example any one or more of monitoring:
  that is reliable, accurate, low cost, convenient, low component count,
  doesn't need additional external terminals (e.g., one or more pins) on a chip having the power circuit,
  doesn't affect switching operation of a power circuit,
  allows device operation nearer to or over a device temperature and/or current rating,
  improves reliability and/or lifetime of a power circuit, and/or allows remedial action before device (e.g., switching device and/or diode) failure, etc.

Thus, embodiments may generally speaking use a temperature-sensitive current source to monitor the temperature of a power switching device such as an IGBT and/or a temperature-sensitive current source to monitor the temperature of a freewheel diode coupled to such a power switching device. Any such current source may include for example a JFET current source. The sense circuitry is generally coupled in parallel with the device control terminal of the power switching device, e.g., may be coupled directly to a gate terminal of such a device. The or each such temperature-sensitive current source may be electrically coupled to, e.g., the first conduction terminal (an emitter terminal in a preferred embodiment) and is generally thermally coupled to the respective monitored device, i.e., power switching device or diode. Thus, the sense circuitry may provide the/each sense signal by sourcing or sinking a sense current that may be measured on the drive control line. Preferably (i.e., optionally), the temperature is, or at least reflects, a temperature of a P-N junction of the monitored device.

Regarding terminology, any 'terminal' mentioned herein may generally be an input or/or output connection of a semiconductor device (generally, power switching device or freewheel diode), and may include an external connection (e.g., a bond pad and/or pin of a chip) and/or an internal connection of a chip (e.g., a source, drain, collector, emitter, anode or cathode device region of a semiconductor chip). An anti-parallel connection of diode to switching device generally may mean that anode and cathode terminals of the diode are connected to different respective conduction terminals of the switching device, e.g., the anode terminal connected to an emitter of an npn switching device and cathode terminal to a collector of such a switching device. Any circuit 'line' mentioned herein may include, e.g., a wire, track and/or terminal.

There may further be provided the power circuit, including drive circuitry coupled to provide to the drive input line a drive signal to control the device control terminal of the power switching device to control switching of the power switching device, the drive circuitry configured to determine at least one operational condition of the power circuit based on the sense signal received on the drive input line, wherein the at least one operational condition includes at least one of: the indicated temperature of the power switching device when the power switching device is in a static state; and the indicated temperature of the freewheel diode when the power switching diode and the freewheel diode are each in a static state. Any one or more such operational conditions is preferably a value of a temperature of the power switching device or of the freewheel diode. The drive circuitry may however alternatively merely determine an above or below threshold such temperature, and/or determine other operational condition(s) such as value(s) of current through the power switching device and/or current through the freewheel diode. Any threshold temperature mentioned herein may be a device rating, e.g., 125° C. or 175° C. for a device such as an IGBT or freewheel diode, or may be determined based on such a rating, e.g., +−5, 10 or 15° C. of the rating.

The drive circuitry may know when the power switching device is static, because it knows when the drive circuitry is actively controlling the device to switch ON→OFF or vice versa. Additionally or alternatively, the drive circuitry may monitor the drive input line to determine when the device conduction state is in transition, and/or implement predetermined delay(s) to ensure that the monitoring occurs during a static period when the power switching device is being held ON (OFF) and preferably further when the diode current is stable, e.g., commutation is not ongoing. Such a predetermined time delay may be, e.g., 10-15 μs (more preferably 12-13 μS) before and/or after a switching event (transition)—such delay(s) should not negatively affect the performance of the power circuit, as steady-state time periods are usually much larger than this. Generally, the sense signal on which basis the operational condition(s) is determined is received on the drive input line when the drive input line is otherwise quiet, e.g., has a stable voltage and/or substantially zero current.

Regardless, the drive circuitry, e.g., gate drive, may be provided separately or integrally to the power circuit.

There may further be provided the power circuit, wherein the sense circuitry includes the temperature sensitive current source thermally coupled to the power switching device and the temperature sensitive current source thermally coupled to the freewheel diode and further includes blocking diodes, each the sense signal includes a current flow of the temperature sensitive current source, and wherein one of the blocking diodes is coupled to block the current flow to the drive input line and the other of the blocking diodes is coupled to block the current flow from the drive input line. Such use of blocking diodes may allow different sense signals to be discriminated. This may be of advantage where sense circuitry includes a diode temperature sense element (e.g., temperature sensitive current source) coupled in parallel with a power switching device sense element, both elements coupled to the same drive input line.

There may further be provided the power circuit, wherein the sense circuitry includes at least the temperature sensitive current source thermally coupled to the power switching device, wherein the at least one the conduction terminal includes an auxiliary emitter terminal of the power switching device.

There may further be provided the power circuit, wherein the sense circuitry is for sensing a temperature and an overcurrent (generally, a current above a threshold current value/magnitude), the sense circuitry having: the temperature sensitive current source, coupled in parallel with the device control terminal; an impedance (generally at least a resistor) in series with the auxiliary emitter terminal of the power switching device; and a blocking diode coupled to block current flow from the temperature sensitive current source to the impedance, and configured to allow current flow from the auxiliary emitter terminal to the temperature sensitive current source, wherein the sense signal received by the drive input line is to indicate current through the temperature sensitive current source (preferably the sense signal includes that current), the blocking diode configured to allow the current flow from the auxiliary emitter terminal to increase output current of the current source when a voltage on the impedance exceeds or crosses a threshold dependent on a threshold voltage of the blocking diode. Thus, where the temperature sensitive current source includes a JFET current source, the current flow may boost voltage on the JFET gate and/or increase the JFET drain current.

As for any form of over-current monitoring mentioned herein, an advantage may be for fast short-circuit detection, preferably allowing measures to be taken to avoid or limit damage.

There may further be provided the power circuit, wherein the sense circuitry is for sensing a temperature and an overcurrent, the sense circuitry having: the temperature sensitive current source (e.g., JFET current source as suggested above), coupled in parallel with the device control terminal; an impedance (generally at least a resistor) in series with the auxiliary emitter terminal of the power switching device; and a switch having a switch control terminal coupled to the impedance, the switch configured to turn on when current from the auxiliary emitter terminal causes a voltage on the impedance beyond a threshold voltage, wherein the drive input line is coupled to receive the sense signal dependent on, e.g., including, current through the temperature sensitive current source and an overcurrent sense signal dependent on (e.g., including) current through the switch. In this case, the switch may include a BJT (bipolar junction transistor).

There may further be provided the power circuit, wherein the switch is configured to, when on, discharge the device control terminal of the power switching device to reduce the current from the first device conduction terminal to the second device conduction terminal of the power switching device. Thus, the switch, e.g., BJT, may in embodiment at least start to discharge a control terminal capacitance of the power switching device, e.g., IGBT gate-emitter capacitance, giving rise to a current limiting effect. Any such current reduction may by useful for power switching devices such as SiC MOSFETs, where short-circuit capability is not guaranteed.

According to a second aspect of the present invention, there is provided a power circuit including: a freewheel diode to, when in a non-blocking state, conduct current from an anode conduction terminal of the freewheel diode to a cathode conduction terminal of the freewheel diode; and sense circuitry coupled to the conduction terminal of the freewheel diode, the sense circuitry to provide a sense signal dependent on a voltage on the coupled conduction terminal of the freewheel diode.

Advantageously, such a power circuit may be provided in the form of a chip having at least three external terminals, to couple to the diode anode, diode cathode and sense circuitry output, respectively. Such a chip may be used in place of a conventional chip component having merely a freewheel diode. Additionally, such as a chip may further include an anti-parallel power switching device and/or drive circuitry as further detailed below.

Thus, an operational condition—preferably (i.e., optionally) current through the diode and/or temperature of the diode—may be determined by means of a sense signal received on a drive line for driving a control terminal of a power switching device, e.g., a drive line to an IGBT gate. Generally, the sense circuitry is thermally coupled to the diode, the indicated temperature preferably being or at least reflecting a P-N junction of the diode. In a preferred embodiment, the sense circuitry is coupled to the anode conduction terminal of the diode. The sense signal preferably includes a current dependent on voltage on the anode. Where an operational condition concerns the diode temperature, the sense circuitry is generally thermally coupled to the diode, the temperature preferably being or at least reflecting a p-n junction temperature of the diode.

There may further be provided the power circuit, including: a power switching device to, when in an ON state, conduct current from a first device conduction terminal of the device to a second device conduction terminal of the device, wherein the freewheel diode is coupled in anti-parallel to the power switching device; and a drive input line coupled to a device control terminal (e.g., gate region) of the power switching device to control switching of the power switching device, the drive input line further configured to receive the sense signal. Such switching control is generally by including voltage on a control region of the power switching device, e.g., gate region. The anti-parallel coupling again generally means that the diode anode and cathode terminals are connected to different respective conduction terminals of the power switching device, e.g., to IGBT emitter and collector, respectively.

There may further be provided the power circuit, including drive circuitry coupled to provide to the drive input line a drive signal to control a device control terminal of the power switching device to control switching of the power switching device, the drive circuitry configured to determine at least one operational condition (preferably one or more values of current and/or temperature) of the freewheel diode based on the sense signal received on the drive input line from the sense circuitry when the power switching device and the freewheel diode are each in a static state. Such drive circuitry, e.g., a gate drive, may be provided separately or integrally to the power circuit.

As above, the drive circuitry may know when the power switching device is static, because it knows when the drive circuitry is actively controlling the power switching device to switch ON→OFF or vice versa. Additionally or alternatively, the drive circuitry may monitor the drive input line to determine when the power switching device conduction state is in transition, and/or implement predetermined delay(s) to ensure that the monitoring occurs during a static period when the power switching device is being held ON (OFF) and preferably further when the diode current is stable, e.g., commutation is not ongoing. Generally, the sense signal on which basis the operational condition(s) is determined is received on the drive input line when the drive input line is otherwise quiet, e.g., has a stable voltage and/or substantially zero current.

There may further be provided the power circuit, wherein the at least one operational condition includes at least one of: a temperature of the freewheel diode when the power switching device and the freewheel diode are each in a static state, wherein the sense circuity is thermally coupled to the freewheel diode; and a value of a current from the anode conduction terminal of the freewheel diode to the cathode conduction terminal of the freewheel diode when the power switching device and the freewheel diode are each in a static state. Again, a static state(s) may be determined based on knowledge of current drive circuitry activity, monitoring of the drive input line and/or use of known delay(s).

There may further be provided the power circuit, including a chip having the freewheel diode, wherein: the chip has an auxiliary conduction terminal that is an external terminal of the chip and the freewheel diode conduction terminal coupled to the sense circuitry is the auxiliary conduction terminal, the chip preferably further including the sense circuitry. In this case, the sense circuitry may include a current mirror coupled between for example a single auxiliary anode and the sense terminal. As for any current mirror mentioned herein, the mirror may be any circuit for mirroring, i.e., copying, a current. The copy current is generally generated in a path parallel to the path having the current to be copied. The copy current may be proportional to, e.g., a fraction or multiple of, the current to be copied. Generally, a current mirror may include two FET transistors with coupled gates, or two BJT transistors with coupled based regions. (A BJT current mirror may be of more interest for use in over-current monitoring in embodiments, due to the need to overcome a (generally about 0.7 V) base-emitter junction voltage of the BJT conducting the current to be copied).

Similarly, a diode package housing at least a diode chip may have at least three terminals. Such a package, preferably for surface mount, may be a plastic or metal package such as an SOIC or TO package.

There may further be provided the power circuit, wherein the sense circuitry includes a temperature sensitive resistor, and wherein the sense signal includes a current through the temperature sensitive resistor. The temperature sensitive resistor, as for any other such resistor referred to herein, may generally be an ohmic resistance at least when at stable temperature. The above-mentioned drive circuitry may be configured to determine an operational condition of the diode based on the current through the temperature sensitive resistor when the freewheel diode is in a static state, generally further when an associated power switching device is in a static state.

There may further be provided the power circuit, wherein: the sense circuitry includes a current mirror to mirror current through the freewheel diode, the sense signal dependent on current through the current mirror. Similarly as above, the current mirror may be coupled between for example a single auxiliary anode and a sense terminal.

There may further be provided the power circuit, wherein the sense circuitry includes a temperature sensitive current source, e.g. a JFET current source, coupled to the conduction terminal of the freewheel diode, the sense signal dependent on current through the temperature sensitive current source.

There may further be provided the power circuit, including: further sense circuitry coupled to the device conduction terminal (e.g., emitter or auxiliary emitter) of the power switching device, the further sense circuitry to provide to the drive input line a sense signal to indicate an operational condition (e.g., at least one value of current and/temperature) of the power switching device, wherein the further sense circuitry and the sense circuitry coupled to the freewheel diode each include a blocking diode, each the sense signal includes a current flow, and wherein one of the blocking diodes is coupled to block the current flow to the drive input line and the other of the blocking diodes is coupled to block the current flow from the drive input line. In this regard, it is noted that discrimination between signals from different sensors may be achieved when the sensors are placed in parallel but opposite directions, e.g. diode for negative voltage and IGBT for positive voltage. In particular, the use of blocking diodes may allow different sense signals to be discriminated in an embodiment. This may be of advantage where sense circuitry includes a diode sense element (e.g., temperature sensitive current source) coupled in parallel with a power switching device sense element, both elements coupled to the same drive input line. Blocking diodes may for example be coupled in series with a (e.g. temperature sensitive) current source and/or in series with a (e.g. temperature sensitive) resistor of the sense circuitry and/or of the further sense circuity. The further sense circuitry may be coupled in parallel with the device control terminal of the power switching device and/or directly to the device input line. The provision of the sense signal by the further sense circuitry may involve the further sense circuitry sinking or sourcing a sense current.

According to a third aspect of the present invention, there is provided a power circuit including a power switching device to, when in an ON state, conduct current from a first device conduction terminal of the device to a second device conduction terminal of the device, wherein the power circuit includes: sense circuitry coupled to the device conduction terminal of the power switching device, the sense circuitry to provide a sense signal to indicate the current from the first the device conduction terminal to the second the device conduction terminal; and a drive input line coupled to a device control terminal of the power switching device to control switching of the power switching device, the drive input line further configured to receive the sense signal.

Thus, a main power switching device current, e.g., main IGBT current, may be sensed and monitored using drive circuitry (e.g., gate drive) that is coupled to drive the drive input line to drive for example a gate terminal of the device. Such driving is generally controls voltage on the line. The sensed main current may be between drain and source, or collector and emitter, of the power switching device as appropriate. The current indication may indicate a value and/or magnitude of the main current. The sense signal may be a sense current sourced or sunk by the sense circuitry, which may be coupled in parallel with the device control terminal of the power switching device. Either end of the sense circuitry may be coupled directly to the drive input line and/or e.g. the first conduction terminal (e.g. emitter) of the power switching device. An embodiment may use a current mirror to mirror (at least a substantially fixed proportion of) current on an auxiliary conduction terminal of a power switching device, e.g., IGBT. Current through the device may thus be monitored, preferably when the power switching device is in a stable ON state (e.g. when conducting current between drain and source or between collector and emitter) or stable OFF state, generally at least when a control voltage on a control terminal of the device is stable. Preferably (i.e., optionally), the mirroring is combined with overcurrent detection to detect an above threshold current through the power switching device.

There may further be provided the power circuit, including drive circuitry coupled to provide to the drive input line a drive signal to control a device control terminal of the power switching device to control switching of the power switching device, the drive circuitry configured to determine at least one operational condition of the power circuit based on the sense signal received on the drive input line when the power switching device is in a static state. Such drive circuitry, e.g., gate drive, may be provided separately or integrally to the power circuit. The operational condition(s) may include one or more values of current and/or temperature of the power switching device, optionally also of an associated freewheel diode if further sense circuitry is provided. Again, the static state(s) may be determined based on knowledge of current drive circuitry activity, monitoring of the drive input line and/or use of known delay(s) as described in relation to other aspects above.

There may further be provided the power circuit, wherein the operational condition includes a value, e.g., magnitude, of the current from the first device conduction terminal of the power switching device to the second device conduction terminal of the power switching device when the power switching device is in a static state.

There may further be provided the power circuit, wherein the first device conduction terminal or the second device conduction terminal is an emitter terminal and the power switching device has an auxiliary emitter terminal, wherein: the device conduction terminal (e.g. the first conduction terminal) coupled to the sense circuitry is the auxiliary emitter terminal; and the sense circuitry includes a current mirror coupled to mirror current from the auxiliary emitter terminal, the sense circuitry to generate the sense signal dependent on current through the current mirror. Thus, an auxiliary emitter terminal may be used to sense a main IGBT current, which in turn may be determined by drive circuitry.

There may further be provided the power circuit, further including a freewheel diode coupled in anti-parallel to the power switching device, the freewheel diode to, when in a non-blocking state (generally having a voltage across the diode such that the diode conducts current from anode to cathode), conduct current from an anode conduction terminal of the freewheel diode to a cathode conduction terminal of the freewheel diode, wherein the power circuit includes: further sense circuitry to couple to the conduction terminal (e.g., anode) of the freewheel diode, the further sense circuitry to provide a sense signal (e.g., a sourced or sunk sense current) dependent on a voltage on the coupled conduction terminal of the freewheel diode; and the drive input line configured to receive the sense signal from the further sense circuitry. For example, both an IGBT and associated freewheel diode may be monitored in such an embodiment.

There may further be provided the power circuit, wherein the drive circuitry is configured to determine at least one operational condition (one or more current and/or temperature) of the power circuit based on the sense signal received on the drive input line from the further sense circuitry when the power switching device and the freewheel diode are each in a static state. For example, a sense current through the sense circuitry and/or a sense current through the further sense circuitry may be used to determine the same or respective operational condition(s).

There may further be provided the power circuit, wherein the sense circuitry to couple to a device conduction terminal of the power switching device and the further sense circuitry each include a blocking diode, each the sense signal includes a current flow, and wherein one of the blocking diodes is coupled to block the current flow to the drive input line and the other of the blocking diodes is coupled to block the current flow from the drive input line, Thus, sense signals/currents may be discriminated even though received on the same drive input line. Each blocking diode may be coupled in series with a (e.g. temperature sensitive) current source or (e.g. temperature sensitive) resistor of the associated sense circuitry.

There may further be provided the power circuit, wherein the current indication by the sense signal indicates an overcurrent condition of the power switching device, wherein the sense circuitry includes: an impedance (generally including at least one resistor) in series with an auxiliary emitter terminal of the power switching device; and a switch having a switch control terminal coupled to the impedance, the switch configured to turn on when current from the auxiliary emitter terminal causes a voltage on the impedance beyond a threshold voltage, wherein the drive input line is coupled to receive the sense signal dependent on (e.g., including) current through the switch.

There may further be provided the power circuit of any above aspect, wherein the sense circuitry, for example a temperature sensitive resistor, presents an impedance of, e.g., 0.5-10 kΩ, to the conduction terminal coupled to the sense circuitry, optionally wherein the sense circuitry having the impedance is the further sense circuitry.

There may further be provided the power circuit having the device control terminal is an electrically insulating gate terminal optionally having an oxide layer.

There may further be provided the power circuit, wherein the power switching device is an IGBT having collector and emitter as the conduction terminals, or may be a MOSFET (e.g. SiC MOSFET), power JFET or HEMT having drain and source conduction terminals. Thus, the power switching device may be a voltage-controlled device, the control terminal (e.g., gate) preferably having an insulating, e.g., oxide layer and thus generally being capacitive. The drive input line coupled to such a device control terminal may be used to control switching of the power switching device by controlling voltage on the control terminal. The power switching device may have n or p polarity, e.g., may be an n-channel or p-channel device, or include and npn or pnp semiconductor junction arrangement.

There may further be provided the power circuit, in the form of a semiconductor chip including the power switching device, the sense circuitry and the drive input line each integral to the semiconductor chip, the semiconductor chip optionally further including the further sense circuitry. Alternatively, there may further be provided the power circuit, including a semiconductor chip having the power switching device, wherein the sense circuitry is bonded to a surface of the semiconductor chip, the power circuit optionally including the further sense circuitry preferably bonded to the surface.

The freewheel diode is generally provided on a separate chip to the associate IGBT chip, i.e., may not be integrated into the same chip as the IGBT. Hence a multi-chip power module may contain, for a single switch element, one or more IGBT chips connected in anti-parallel with one or more diode chips.

It is however noted that where the power switching device may in embodiments be a so-called "reverse-conducting" IGBT (RC-IGBTs, also known as BiGTs). Reverse conducting capability of such a device may effectively include freewheel diode functionality within the IGBT chip. However, in embodiments such a power switching device is preferably treated the same as any other IGBT as described herein, noting for completeness that the freewheel diode-related features would not be required in such a case.

There may further be provided the power circuit of any one of more of the above aspects and having any one or more the above optional features. The power circuit may include one or more chips, for example bare power switching device (e.g., IGBT) and/or diode chips bonded (e.g., soldered or sintered) to an insulating substrate with a conducting layer on top to distribute current between chips. In a less preferred embodiment the power circuit may be housed in a plastic or metal package such as an SOIC or TO package—the power circuit may be provided as a surface mount component. Generally speaking, compared to a conventional power switching device and/or power diode provided as a chip or as a package (generally plastic and/or for surface mount) housing such a chip, e.g., an IGBT package, such a power circuit may not need any additional external terminal. A power circuit embodiment may therefore be provided in a form that can allows convenient substitution of a conventional power switching device and/or diode package. A single external terminal of the chip/package, e.g., gate terminal, can be used for monitoring one or more operational parameters, e.g., T and/or I of the power switching device and/or diode.

A module may include one or more power switching devices, e.g., may include a single power switching device may be for example a multi-chip module. A module having multiple devices may provide a half-(full-) bridge circuit having 2(4) such devices, or a three-phase bridge circuit having 6 power switching devices, the module optionally with a freewheel diode associated with the/each such device. Each power switching device may be provided on the same, or a different, chip to such an associated freewheel diode. For example, some chopper modules for DC-DC conversion may have separate IGBT and diode chips.

A preferred embodiment is a multi-chip module including at least one power circuit of any one of the above aspects, the multi-chip module including a plurality of semiconductor chips each having the power switching device of a respective the power circuit, the multi-chip module including: a module drive circuit (e.g., gate drive) configured to control switching of the power switching devices by controlling (generally voltage on) device control terminals of the power switching devices, the module drive circuit including the drive circuitry of each the power circuit, wherein the module drive circuit is configured to receive at least one the sense signal from the drive input line of each of the at least one power circuit and to determine at least one operational condition of the multi-chip module based on each the received sense signal. Each such semiconductor chip may further include a freewheel diode coupled in parallel with the power switching device. The operational condition(s) may include one or more current and/or temperature value (s), and/or average and/or summed such current and/or temperature value(s).

Where current and/or overcurrent detection is implemented in such a multi-chip module, the total drive circuitry current may be simply proportional to the sum of the main chip currents, e.g., a function of the total module (over) current. For temperature, the total drive circuitry current (e.g., positive for IGBT(s), negative for respective freewheel diode(s)) may be proportional to an aggregate and/or average of the chip temperatures.

There may further be provided the multi-chip module where the module drive circuit is configured to receive the sense signal from any the further sense circuitry, the module drive circuit to determine the at least one operational condition based on each the sense signal received on the drive input line from each the power circuit having the freewheel diode. The operational condition(s) may include one or more current and/or temperature value (s) for the freewheel diode, and/or average and/or summed such current and/or temperature value(s).

According to another aspect of the present invention, there is provided drive circuitry for driving a power switching device of a power circuit, the drive circuitry having a drive output line to be coupled to a device control terminal of the power switching device to control switching of the device, the drive output line further to receive at least one sense signal, the drive circuitry to determine at least one operational condition of the power circuit on the basis of the at least one sense signal, wherein the operational condition includes at least one of:

a current from a first conduction terminal of the power switching device to a second conduction terminal of the power switching device when the power switching device is in a static state;

a temperature of a freewheel diode coupled in anti-parallel to the power switching device when the power switching device and the freewheel diode are each in a static state; and a current from an anode of a freewheel diode to a cathode of the freewheel diode, the freewheel diode coupled in anti-parallel to the power switching device when the power switching device and the freewheel diode are each in a static state, wherein the at least one operational condition preferably further includes a temperature of the power switching device when the power switching device is in a static state.

There may further be provided a power circuit including the drive circuitry and further including at least one of the power switching device and the freewheel diode, the power circuit preferably as defined in any one or more of the above aspects.

Any one or more of the above aspects and/or any one or more of the above optional, i.e., preferable, features of the preferred embodiments may be combined, in any permutation. Furthermore, any of the above apparatus may be provided as a corresponding method.

Failure of a power device is sometimes predictable by monitoring operation the device, for example by monitoring for unexpected device operation. In this regard, embodiments of the present invention may provide power semiconductor device junction temperature and/or current sensing for a power switching device (e.g. IGBT) and/or a flywheel diode. Temperature and/or current sensor circuitry of an embodiment may directly measure current and/or junction temperature of a power device chip. Thus, the sensing preferably (i.e. optionally) is provided by on-chip measurement.

Example advantage(s) of embodiments include having knowledge of current(s) and/or temperature(s) for every converter switching cycle at gate drive circuitry level. For example, data at the drive circuitry may allow real-time knowledge of what current is going through a load. There may then be less need for example for a Hall sensor and/or a resistive shunt, which may otherwise be implemented at converter level, e.g., on cables out to the load. Similarly, there may be less need for a Rogowski coil or for an inductor in series with the power switching device and associated signal integration, e.g., to measure collector current, that may affect accuracy.

The temperature and/or current data from the drive circuitry may be sent periodically, e.g., every 20 us or more, to a central controller. The central controller may then for example determine how hard the monitored device is to be driven, e.g., under or over a current and/or temperature rating of the device. Additionally or alternatively, such a central controller may monitor one of more power circuits to predict future performance, failure or lifetime.

The sensing of an embodiment may be applicable to both power switching device chips and diode chips, and/or to chips having both a power switching device and a freewheel diode. An embodiment having the sensing may be implemented singly or in multi-chip power modules. In this regard, embodiments are generally described and/or illustrated herein with reference to an IGBT as such a power switching device. However, embodiments may equally be applied to any voltage-driven insulated gate device, e.g. MOSFET, power JFET or HEMT. The sensing circuitry of any embodiment may be integrated into a surface, e.g., the top surface, of the device chip, or fabricated separately and then bonded to such a surface, whether the chip has the power switching device and/or flywheel diode.

Embodiments may integrate temperature and/or current sensors on a device chip which has one or more current outputs, i.e., current output(s) each having current through them that is dependent on the temperature and/or main current of the power device (switching device or diode). Such current may be drawn from a device control terminal, e.g., gate terminal, of the power switching device (e.g., IGBT gate terminal). The current may be measured easily in the drive circuitry (e.g., a gate drive that is for providing a gate voltage to control device switching of a power switching device such as an IGBT). Advantageously, this may be achieved without requiring separate connections to the device chip. Such embodiments may be implemented easily in high power multi-chip device modules and gate drives.

Figure 2:
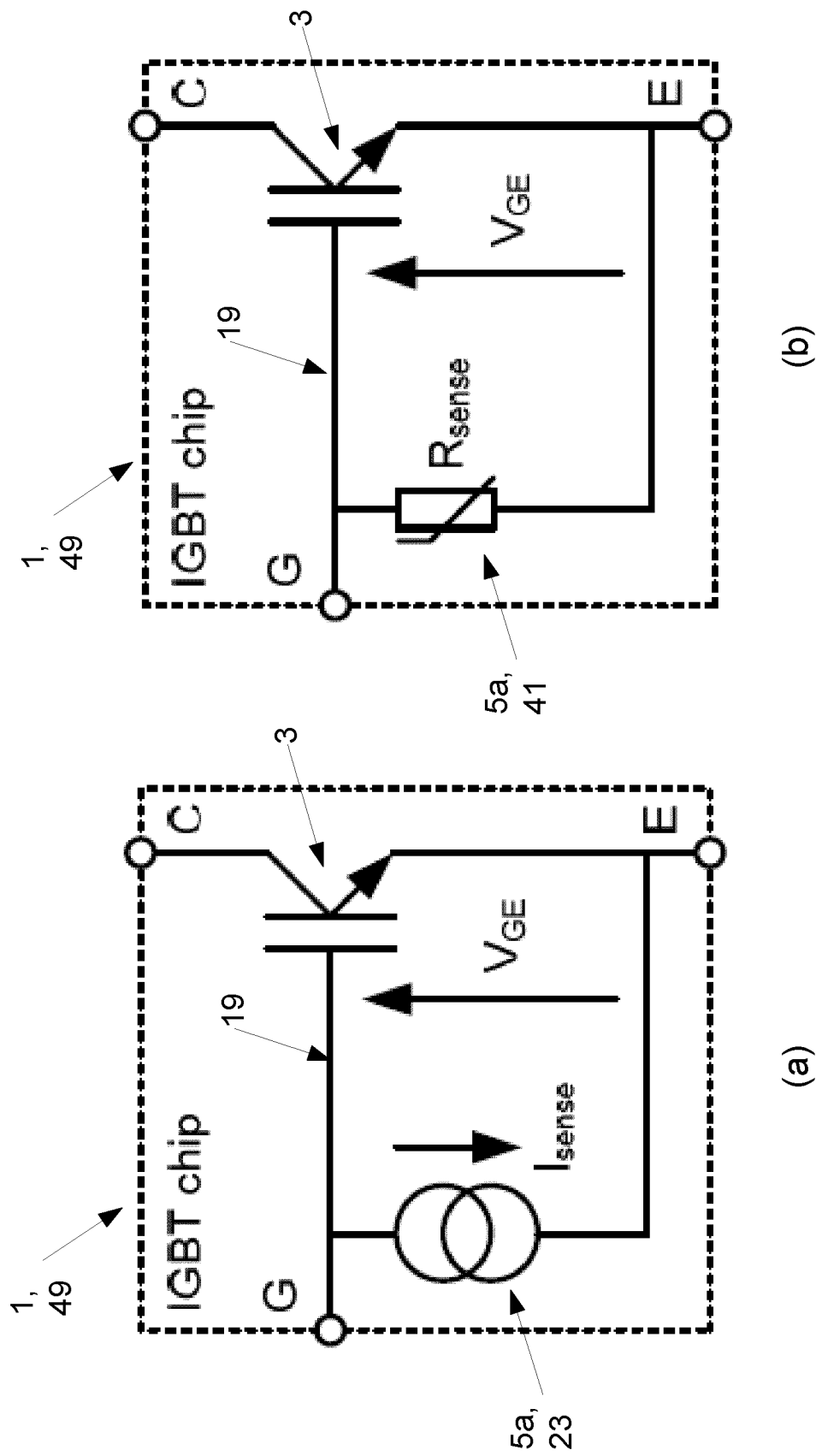
FIG. 2 (a) shows an example power circuit having an IGBT temperature sense current source.
Figure 3:
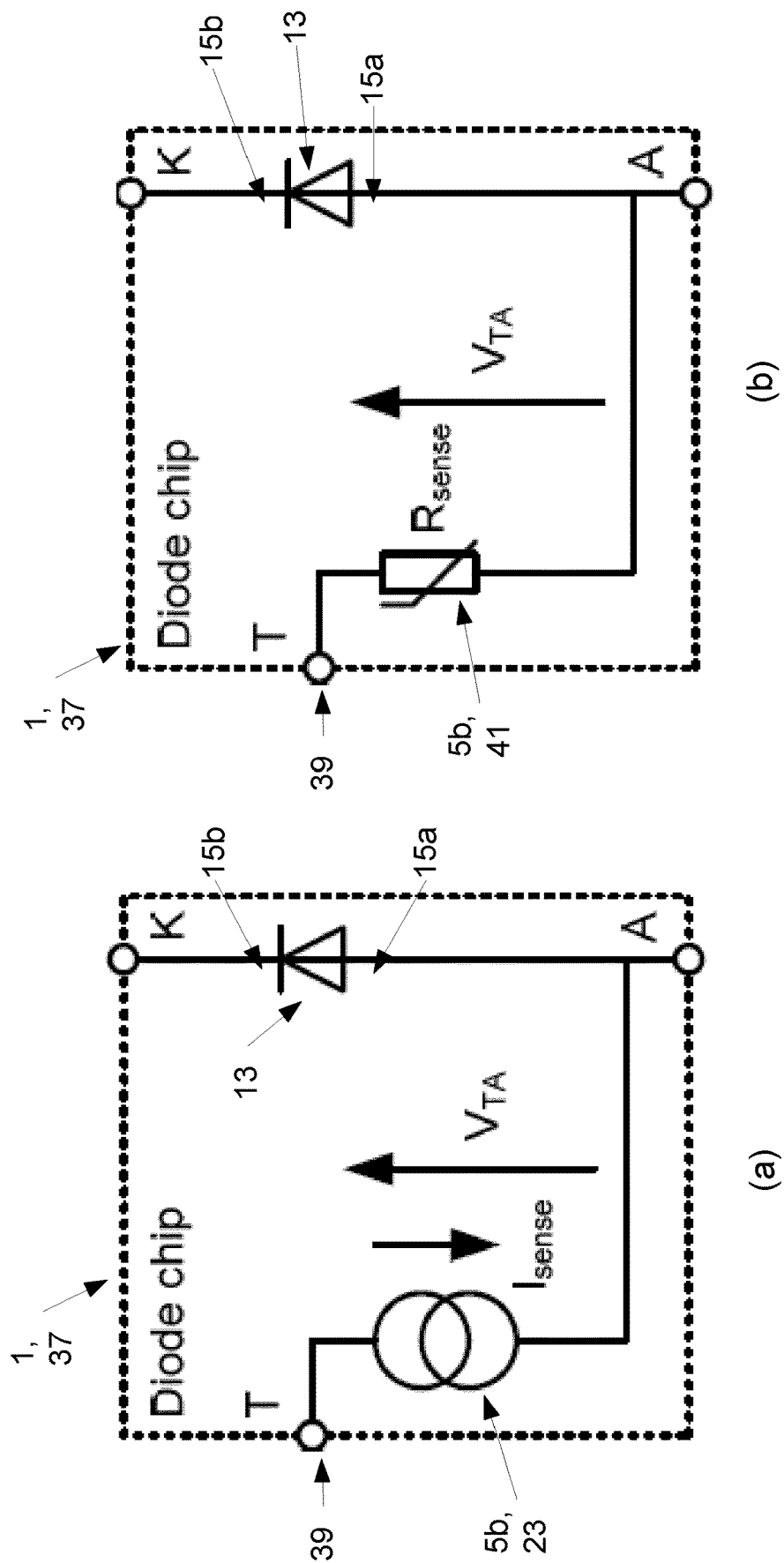
FIG. 3(a) shows an example power circuit having a diode temperature sense current source.
FIG. 3(b) shows an example of power circuit having a diode temperature sense resistor.

Example embodiments may include any one or more of the following:
- a temperature-sensitive resistance placed in parallel with a gate-emitter capacitance (generally oxide) of a power switching device, e.g., IGBT, in order to measure device temperature (FIG. 2(b));
- a temperature-sensitive resistance placed in parallel with an additional temperature sense terminal added to a freewheel diode chip in order to measure device temperature (FIG. 3(b));
- a current mirror added to an auxiliary emitter of a power switching device, e.g., IGBT. The output of the device current emitter may be connected to the device gate in order to measure main-current through the device (FIG. 5);
- a current mirror added to a freewheel diode chip in order to measure current through the diode.

Considering advantage(s), the temperature sensing in an embodiment may measure power device junction temperature directly without having to estimate it using complex algorithms and/or difficult-to-measure temperature-sensitive electrical parameters. This, (and/or another) embodiment may enable power converter rating/performance improvements by allowing the converter to be operated at a higher load, and/or may enable availability improvements (and thus potentially operating cost reduction) from advance warning of unexpected device operation.

Figure 15:
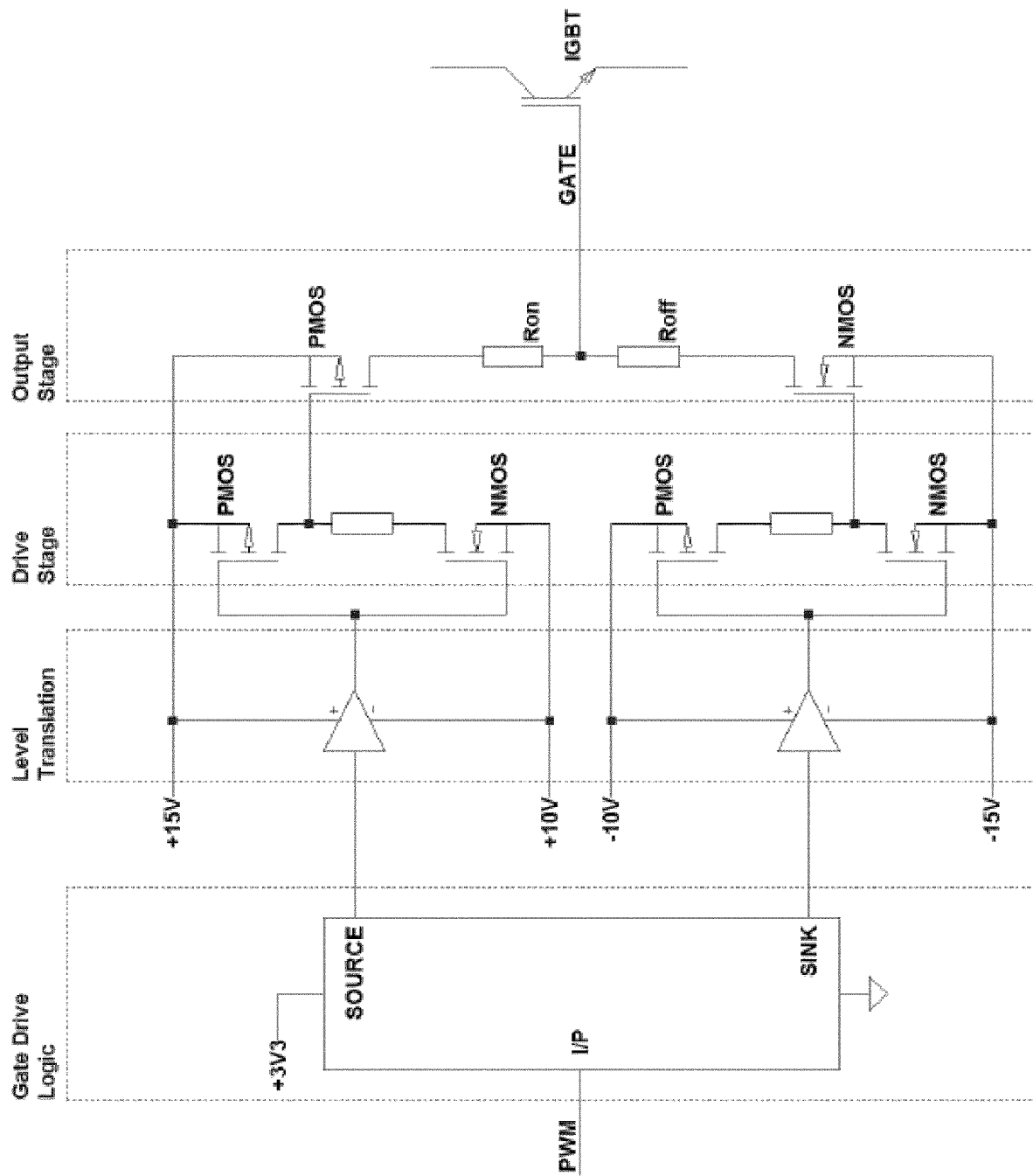
FIG. 15 shows drive circuitry of an IGBT gate drive.

An IGBT gate drive according to an embodiment of the invention includes the elements shown in FIG. 15. FIG. 15 shows drive circuitry in form of a typical IGBT gate drive (FIG. 15 further showing the IGBT driven by the output stage of the gate drive via the drive input line labelled GATE). The drive circuitry has gate drive logic including digital logic circuits reference to a 3.3 or 5 V power supply which receives an incoming signal (PWM) indicating when to switch the power switch (e.g., IGBT) ON and OFF. The gate drive logic creates signals (SOURCE and SINK) indicating when current is to be supplied to and removed from the power switch respectively. A level translation stage is typically required to drive the power switch over a wider voltage range, e.g., −10 V to +15 V. The output stage for driving an IGBT includes transistors P and N channel MOSFETS (labelled PMOS and NMOS) or bipolar PNP and NPN transistors with a turn-ON resistor (Ron) and a turn-OFF resistor (Roff) which are chosen to match the characteristics of the power switch and/or load. The output stage transistors can handle high current and normally require a drive stage as the digital logic and level translation cannot provide enough current to turn them on and off directly.

Figure 16:
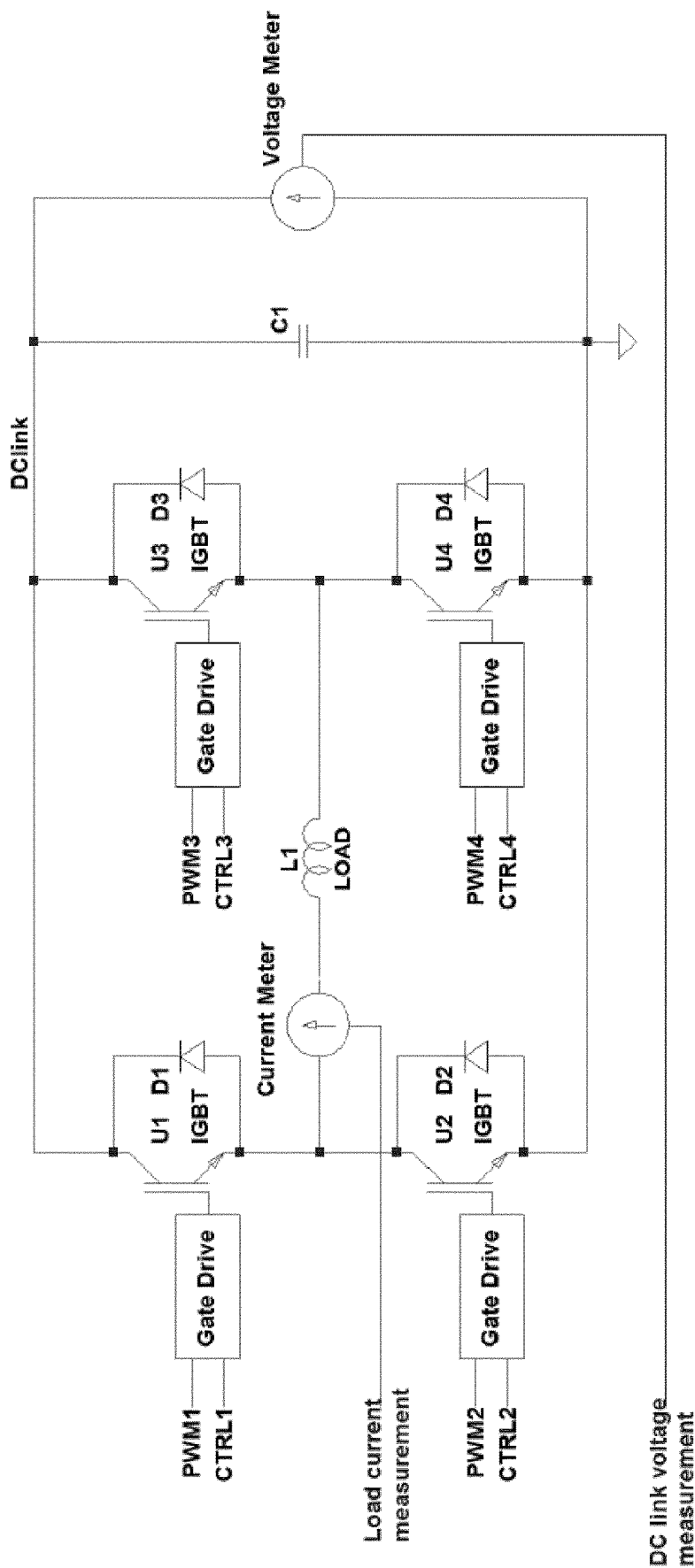
FIG. 16 shows a power converter having a full-bridge circuit.

A power converter according to an embodiment of the invention, an example of which is shown in FIG. 16, may include multiple power switches, e.g. IGBTs (e.g., any one or more of U1 to U4), a load (L1), and preferably a capacitor bank (C1) which maintains a voltage across the converter (DClink). FIG. 16 shows a typical power converter having, in this example converter, a full-bridge circuit. Embodiment(s) of the present invention may be implemented to monitor any one or more of the power switching devices U1-U4 and/or freewheel diodes D1-D4, such monitoring preferably being performed by drive circuitry in the form of any one or more of the gate drives.

FIG. 16 may be considered as showing two half bridge circuits (U1/D1+U2/D2, and U3/D3+U4/D4) providing a full bridge circuit to drive the load L1. (Generally, a power circuit such as for a power converter or other any other power application may include at least one half-bridge circuit). Thus, U1 and U2 (similarly U3, U4) provide a series connection of first and second power switches of a half bridge circuit. In FIG. 16 each power switch is coupled in anti-parallel with an optional free-wheeling diode (D1-D4).

Figure 17:
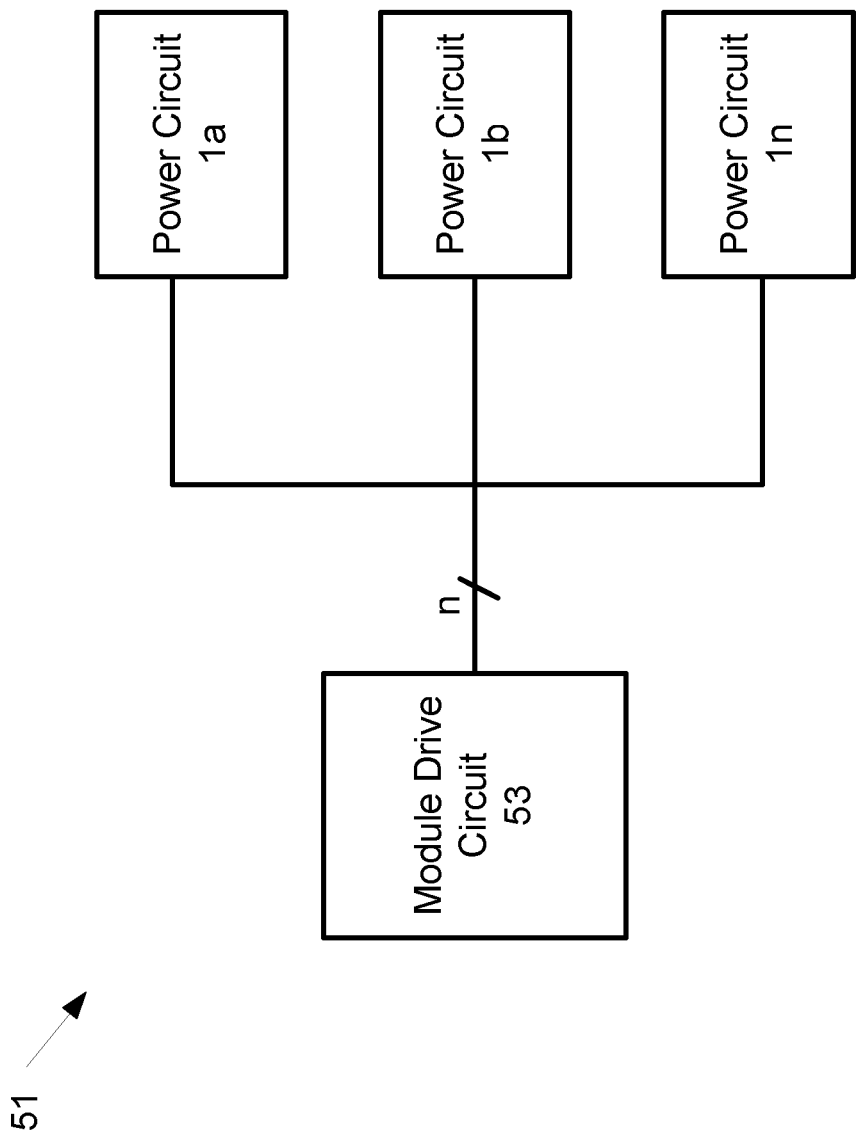
FIG. 17 shows an example multi-chip module.

FIG. 17 shows an example multi-chip module, including a module drive circuit 53 configured to drive the power switching devices of power circuits 1a ... 1n. The drive output/input line of the module drive circuit may include a respective line for each power circuit or a single such line for all power circuits. Generally, parallel chips share control/sense lines, so that n may be 2 (excluding collector sense) or 3 (including collector sense). For power switching device chips connected in parallel to make up a single switch element, they may all share a single set of drive terminals, i.e. one collector sense, one gate and one emitter sense terminal shared between them. In this case, the drive output/input line of the module drive circuit may be a line in common for multiple power circuits. Each power circuit may include a freewheel diode in addition to the power switching device.

Figure 18:
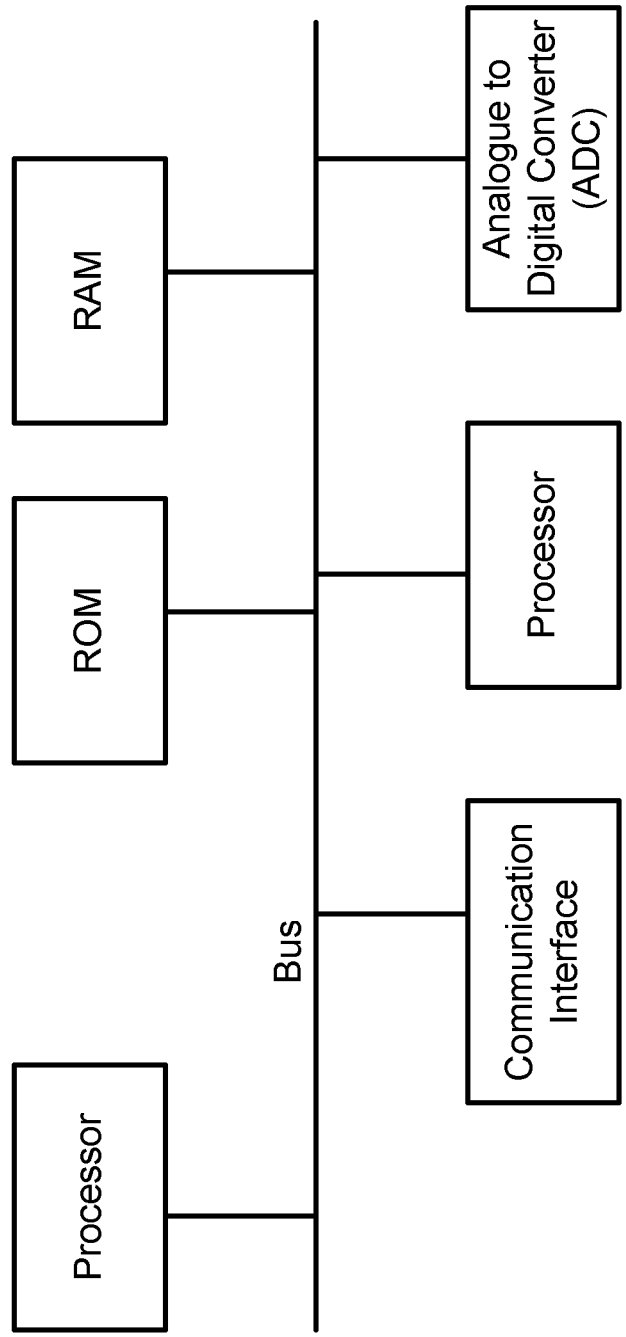
FIG. 18 shows an example computing apparatus, any one or more elements of which may be present in an embodiment.

FIG. 18 shows an example computing apparatus, any one or more elements of which may be present in an embodiment, for example in a gate drive or module drive circuit, for determining at least one operational condition based on received sense signal(s).

Turning more specifically to power device monitoring, we now consider mainly integrated on-chip sensors with current outputs. In this regard, FIG. 1 shows a principle of operation of a power circuit embodiment that uses current to measure device behaviour, the power circuit here including at least the IGBT module having a power switching device in the form of an IGBT.

A principle of operation of the FIG. 1 embodiment is that, in the static case where a power switching device such as an IGBT is not switching, there is practically no gate current flowing. Hence there may be an opportunity to use the current drawn from the gate drive to indicate the value of temperature and/or current. The IGBT gate is voltage-controlled, so effectively the voltage is used to communicate in one direction (gate drive to device) and the current drawn from the gate drive used to communicate in the other direction (device to gate drive). By measuring the static current drawn from the gate drive in the on- or off-state by means of sense circuitry (see current Isensor in FIG. 1), these additional measurements can be made by the gate drive without requiring extra connections between gate drive and device, so would be compatible with existing multi-chip power device modules. Effectively two-wire communication may be created between gate drive and devices in such an embodiment. (Noting that, a sense resistor Rsense of the gate drive may be combined with the gate resistor $R_G$).

We now consider specifically a temperature sensor. In this regard, FIG. 2(a) shows an IGBT temperature sense current source, and FIG. 2(b) shows an IGBT temperature sense resistor. Thus, the sense circuitry of FIG. 2(a) is shown as a current source conducting current Isense, whereas FIG. 2(b) shows sense circuitry in the form of a temperature sensitive resistor Rsense. A current source is generally circuitry that is configured to provide a substantially constant current (disregarding effects of the environment such as temperature). Such a current source may include a transistor with feedback, e.g. as shown in the JFET current source of FIG. 6. A person skilled in analog circuit design is aware of various circuits generally known for use as a current source, for example an LM334 current source from Texas Instruments (TM) or current limiting diode CLD20B from Micro Commercial Components (MCC)™.

Generally, a temperature-sensitive element is placed in parallel with the gate-emitter capacitance (oxide) of the IGBT. This element may be realised, for example, as a pure current source, or a simple temperature-dependent ohmic resistance. An impedance of the order of e.g. 0.5 to 10 kΩ may be required, to limit the power dissipation but draw sufficient current for discrimination. This element is designed to be temperature-dependent, so that in the IGBT static condition (on or off state) the current drawn by the element can be measured and its temperature calculated. Due to thermal coupling between the IGBT and temperature-sensitive-element, the measured and/or calculated temperature can be taken to represent the IGBT temperature.

The current source or resistance may be placed directly on top of the IGBT chip, or integrated into the IGBT chip itself (e.g. in the polysilicon). If in an embodiment the current source or resistance may interfere with usual IGBT operation, this can be avoided or reduced by ensuring that the impedance is high enough.

A similar approach may be used for a freewheel diode chip. Although a conventional such chip does not have a third terminal, a temperature sense 'terminal' (connection) could be added, which connects to one end of a sense element (current source or resistance): the other end of the element connects to for example the anode terminal of the diode, which may be at IGBT emitter potential. Thus, the other end of the element may connected to the top surface of a freewheel diode chip. Regardless, the temperature sense element may be thermally coupled to the diode. The temperature sense terminal could be connected to the IGBT gate, so that the diode temperature sense element would be in parallel with the IGBT sense element. Discrimination between signals from the two temperature sense elements (for IGBT and diode respectively) is covered below regarding example implementations.

In this regard, FIG. 3(a) shows sense circuitry in the form of a diode temperature sense current source (see current Isense), and FIG. 3(b) shows sense circuitry in the form of a diode temperature sense resistor (Rsense). (In embodiments where sense circuitry is also provided for the monitoring the power switching device, this sense circuitry may be referred to as further sense circuitry). Sense terminal T is connected to the IGBT gate terminal G; anode A to the IGBT emitter E; cathode K to the IGBT collector C.

Figure 5:
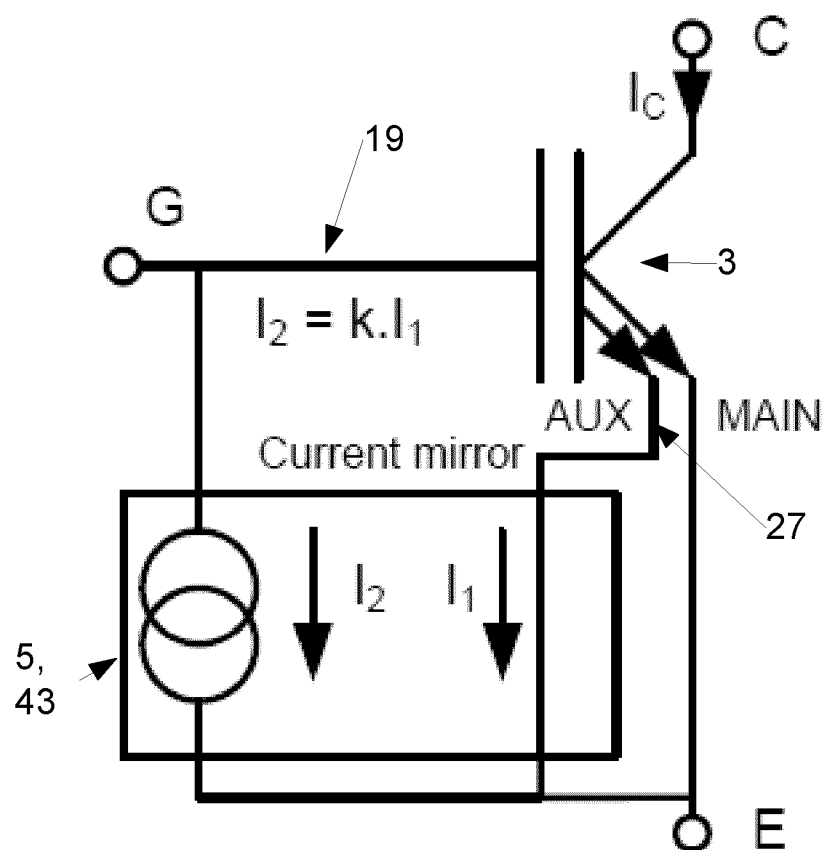
FIG. 5 shows an example power circuit having current mirror measurement of IGBT on-state current.

We now consider specifically a current sensor. In this regard, FIG. 5 shows current mirror measurement of IGBT on-state current. Similarly to temperature, device (e.g., IGBT) current is generally a useful measurement to make during operation.

Figure 4:
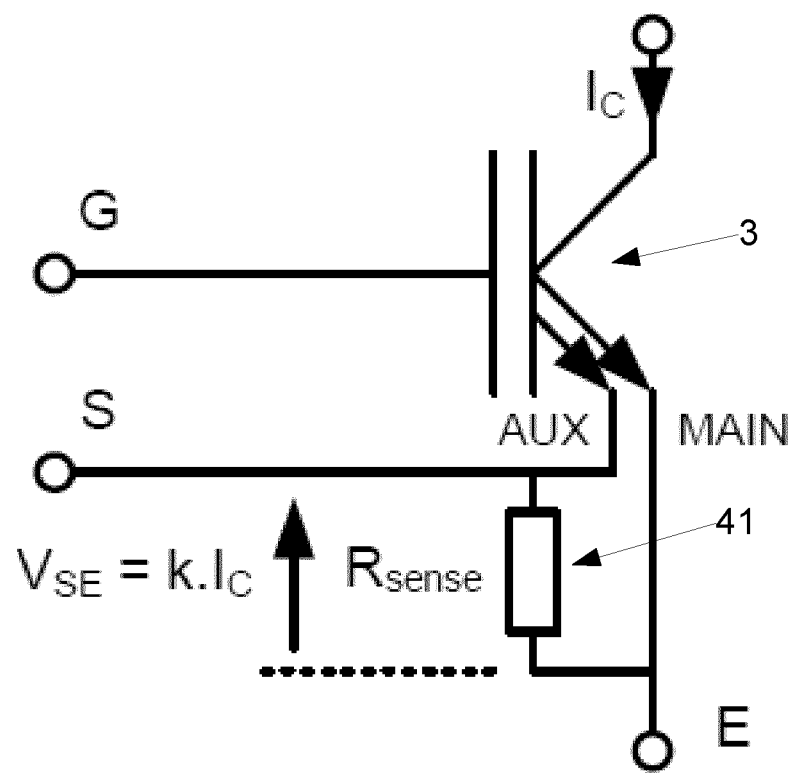
FIG. 4 shows a prior art on-chip current sensor using auxiliary IGBT cell.

An alternative method for single-chip IGBT switches, for example as used in small "intelligent power modules" (IPMs), is on-chip measurement using the auxiliary IGBT cell, see FIG. 4; a disadvantage of using this for multi-chip power modules is that—even if the auxiliary emitter terminals are hard paralleled—an extra connection is required back to the gate drive for each IGBT die. It should further be noted that this may generally only be suitable for over-current (e.g. short circuit) detection since it is only under this condition that a significant enough voltage VsE is generated across the sense resistor; at normal currents the accuracy may not be high enough to use as a true current sensor.

An embodiment such as that of FIG. 5 may add sense circuitry in the form of a small current mirror, preferably to the auxiliary emitter conduction terminal AUX of the power switching device. The input to the mirror is the current flowing through the auxiliary emitter, with the output connected to the gate. Therefore the (small) current drawn from the gate drive is proportional to the on-state current flowing through the main IGBT. This is shown in FIG. 5. Generally, an auxiliary emitter may carry, e.g., less than or equal to 0.1% of total emitter current and therefore use of an auxiliary emitter may have minimal impact on device operation.

In an embodiment, the current mirror may be integrated into the power device chip, e.g., the top surface of an IGBT chip (at or near to emitter potential). Given that the auxiliary emitter current is a small proportion of the main current, the current drawn from the gate will be small. In this regard, one consideration of an embodiment may be to reduce or avoid a negative feedback effect, where extra current flowing from the emitter draws current from the gate-emitter capacitance, thus decreasing the gate voltage and reducing the main IGBT current. However, since only a small proportion of the main device current flows through the mirror in an embodiment, this effect may not be significant. In some embodiments it may be considered to reduce or avoid temperature dependency in the current mirror. It may generally be preferred that the current mirror does not present a significant voltage drop to the auxiliary current, otherwise this may in an embodiment limit the current flowing through the mirror and hence affect the accuracy of the sensor; it may be preferred to use a FET current mirror to achieve this.

A similar current sensing implementation could be achieved for a freewheel (otherwise known as a flywheel or freewheeling diode) diode in anti-parallel with the IGBT. However, a different implementation of current mirror may be required between the single auxiliary anode cell and the sense terminal (connected to the IGBT gate as described above with reference to FIGS. 2(a) and (b)), since the current is flowing from emitter (diode anode) to collector (diode cathode), i.e. in the opposite direction to that through the IGBT. It should be noted that sensing overcurrent in the diode may be of less interest, (a) because there may be no way to turn off the diode (as with an IGBT) if an overcurrent occurs, and (b) such an overcurrent may only occur in a typical converter as a secondary consequence of a short circuit in another device which should generally have been detected already.

Regarding more specific example implementations, we now consider specifically a current source temperature sensor.

Figure 6:
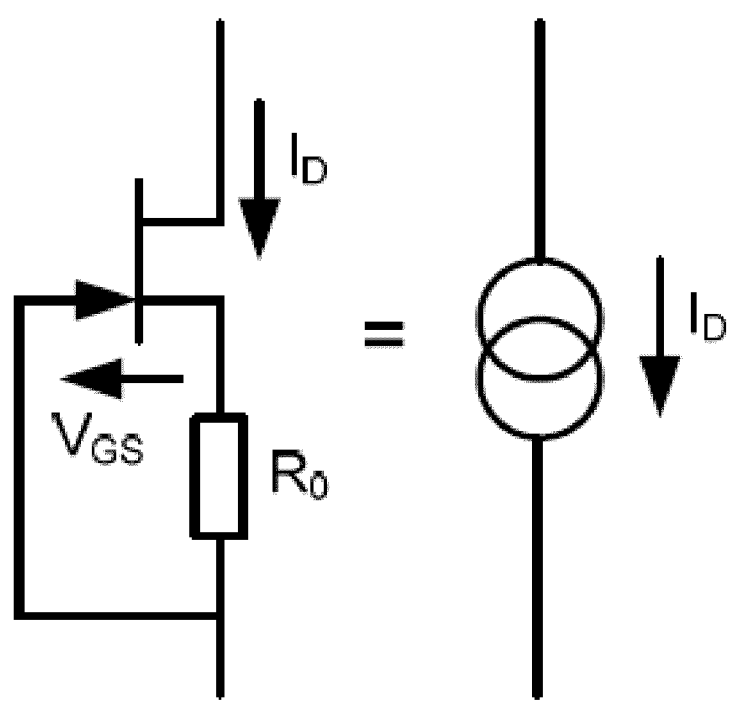
FIG. 6 shows a JFET current source.

A current source can be created from a JFET plus a resistor. This is a known circuit, and is shown in FIG. 6. Such a current source may be provided commercially in discrete parts, known as current limiting diodes or current regulator diodes.

Figure 7:
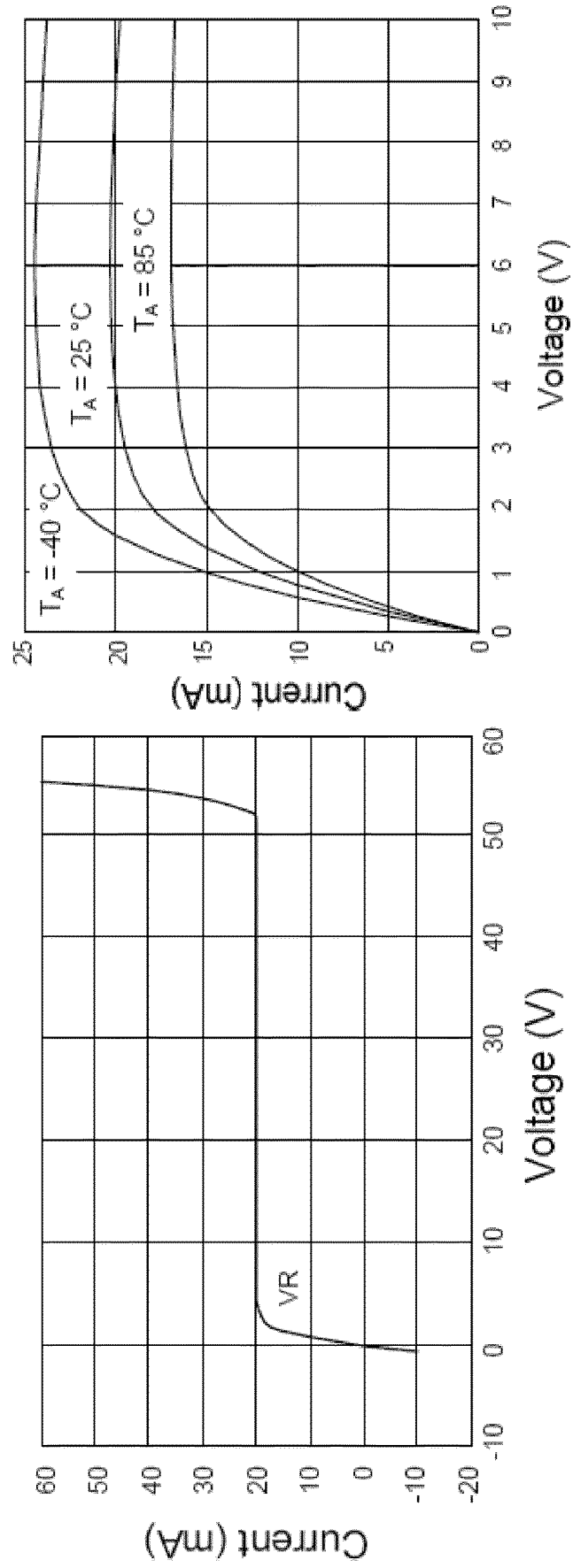
FIG. 7 shows an I-V curve for a CLD20B current limiting diode.

FIG. 7 shows two interesting attributes of the current source: (a) the relative insensitivity to voltage (which would be VGE in this case), and (b) the temperature dependence, in this example approximately −0.048 mA/K at 7.5 V and 25° C.

Figure 8:
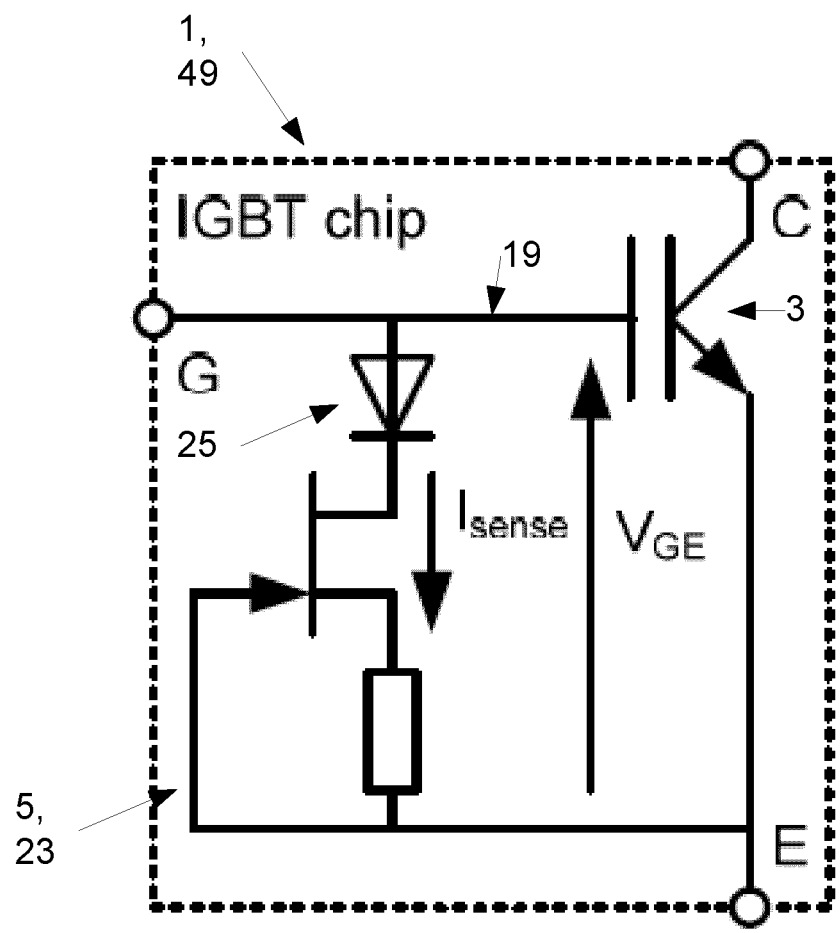
FIG. 8 shows an example power circuit having sense circuitry including a unidirectional current source with blocking diode.

Furthermore, a diode could be connected in series with the JFET current source, which would generally not affect the current supplied by the source, as shown in FIG. 8 having a unidirectional current source with blocking diode. This may have one or more of the following advantages:
(a) conduction is blocked when a reverse voltage is applied.
(b) discrimination can be achieved between two sensors placed in parallel but in opposite directions, e.g. diode for negative voltage and IGBT for positive voltage (see below description of an implementation with reference to FIG. 11).
(c) between 0 V and the diode turn-on voltage (e.g. 0.7 V) only diode leakage current flows. This may allow the power device manufacturer to still measure the IGBT gate leakage current using a voltage in this range.

Figure 9:
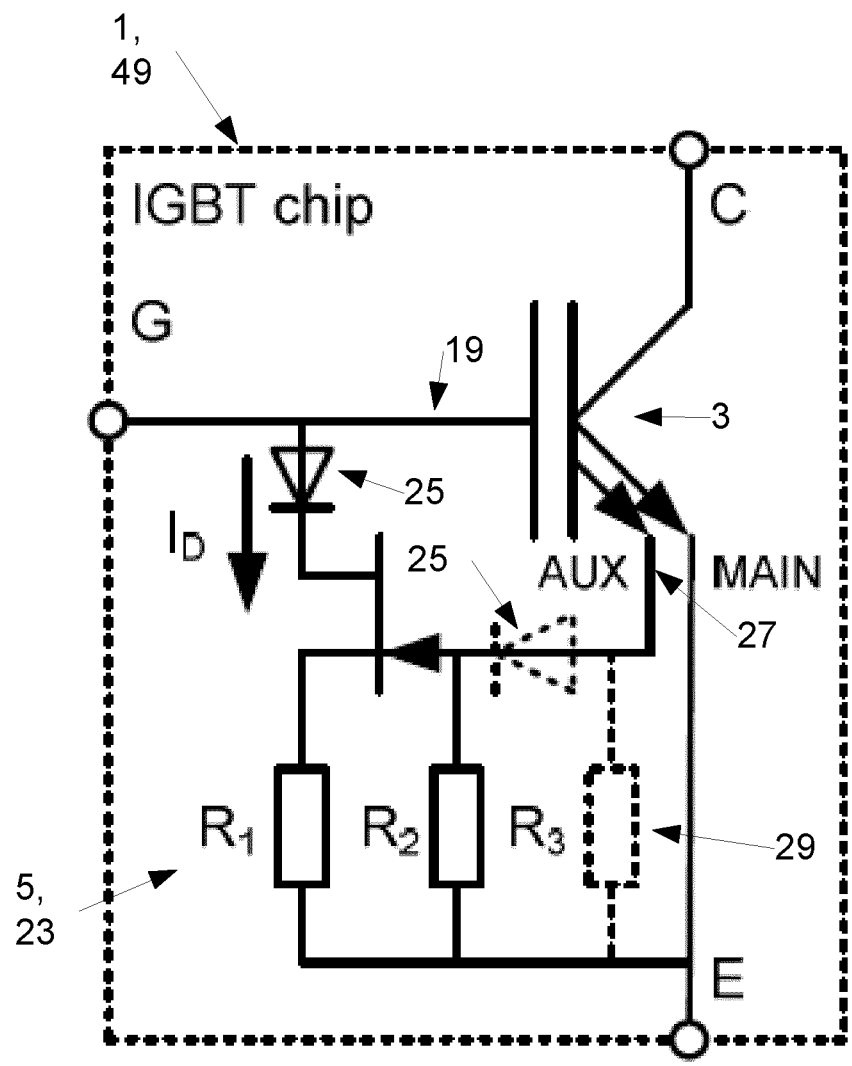
FIG. 9 shows an example power circuit wherein the sense circuitry includes a current source modified to include overcurrent detection.

We now consider an example implementation of a combination of temperature and current sensing. In this regard, FIG. 9 shows sense circuitry including a current source modified to include overcurrent detection. The diode and resistor (R3) shown dotted may be added to avoid normal current levels disturbing the temperature sensor.

A combined temperature and overcurrent sensor may be created with a modification to the JFET current source shown in FIG. 6. Shown in FIG. 9, an overcurrent flowing from the auxiliary emitter may be used to boost the JFET gate voltage, and hence increase the JFET drain current. An embodiment may rely on the appropriate selection of resistors R1 and R2, such that normal levels of IGBT collector current do not disturb the temperature sensing operation and/or that overcurrents cause a significant increase in sensor current to allow the gate drive to discriminate correctly; this may be aided, for example, by including a diode between the auxiliary emitter and JFET that only becomes forward biased in an overcurrent event (see dotted components in FIG. 9).

Figure 10:
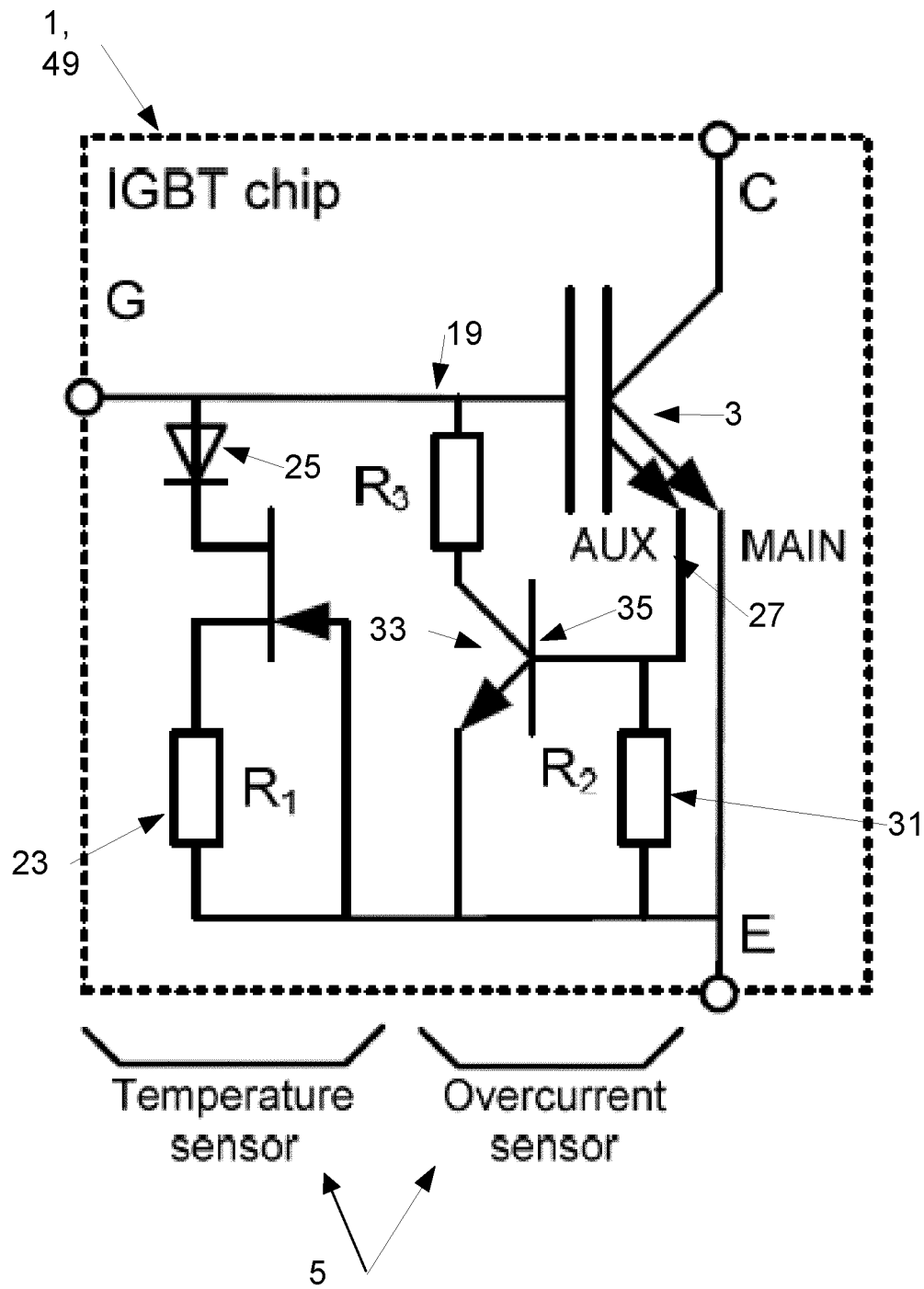
FIG. 10 shows an example of a power circuit that uses a separate overcurrent detection circuit to supply a large increase in gate current.

An alternative embodiment may keep the overcurrent sensor separate from the temperature sensor, so that a large increase in gate current may be detected easily as an overcurrent event. This may use a simple BJT switch integrated into the IGBT chip, as shown in FIG. 10. R2 is preferably selected such that the overcurrent through the auxiliary emitter would generate a voltage drop equal to the base-emitter threshold voltage of the BJT, typically 0.7 V, although this may be temperature-dependent. R3 may be selected to limit the current drawn from the gate when overcurrent was detected. If R3 was low enough, then the BJT may in embodiment actually start to discharge the IGBT gate-emitter capacitance, giving rise to a current limiting effect. This may be useful for power devices such as SiC MOSFETs, where short-circuit capability is not guaranteed, but of less interest for IGBTs which are typically able to support short circuits for 10 μs; this circuit may limit overcurrent sufficiently to allow the gate drive time to turn the MOSFET off.

In this regard, FIG. 10 shows sense circuitry including a temperature sensor and use of a separate overcurrent detection circuit (overcurrent sensor) to supply a large increase in gate current. The JFET and R1 form the temperature sensor. The BJT, R2 and R3 form the overcurrent sensor; R3 sets the gate current drawn when an overcurrent is detected.

Figure 11:
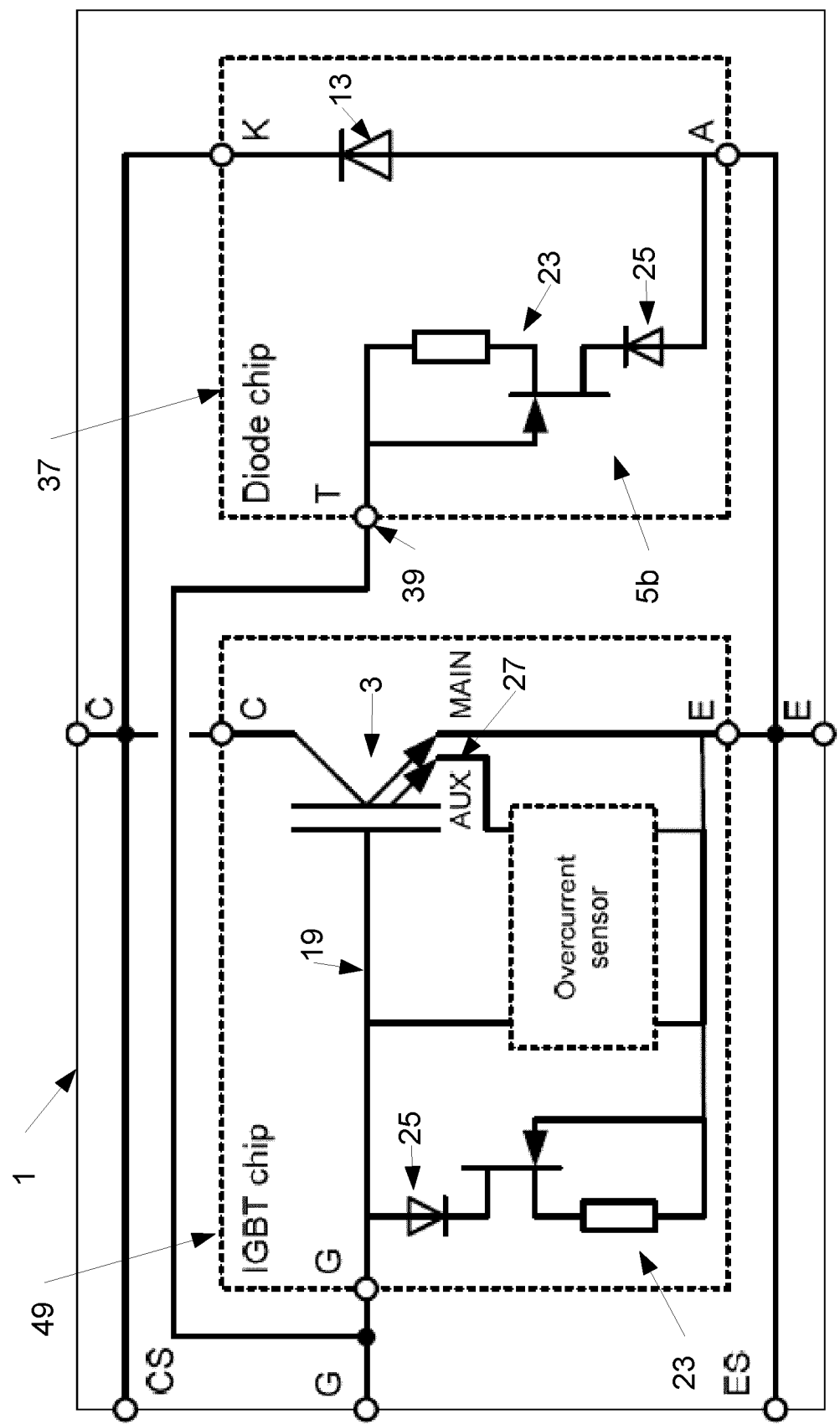
FIG. 11 shows schematically a more detailed example of a power circuit, at chip level.

In view of the above, we now consider a more comprehensive example implementation. In this regard, FIG. 11 shows schematically a more complete circuit at chip level, including sense circuitry for temperature sense and overcurrent sense of the power switching device and further sense circuitry for temperature sense of the freewheel diode.

Combining the IGBT temperature and overcurrent sensors with the diode temperature sensor may be achieved using the series diodes as proposed above with reference to FIG. 8. An example of the complete implementation for anti-parallel IGBT and diode chips is shown in FIG. 11 (embodiments of which may generally be considered as combinations of FIGS. 3(a) and 10). In the on-state (VGE=+15 V for example), the positive gate current drawn measures the IGBT temperature, and allows detection of IGBT overcurrent. In the off-state (VGE=−10 V for example), the negative gate current drawn measures the diode temperature.

Some or all device chips in a multi-chip module may be able to utilise the principles and/or embodiments described above. For the overcurrent detection, the total gate current into the module may be simply proportional to the sum of the main chip currents, i.e. a function of the total module overcurrent. For temperature, the total gate current (positive for IGBT, negative for diode) may be proportional to an aggregate of the chip temperatures, i.e. some form of average depending on the current sensor temperature dependency.

Figure 14:
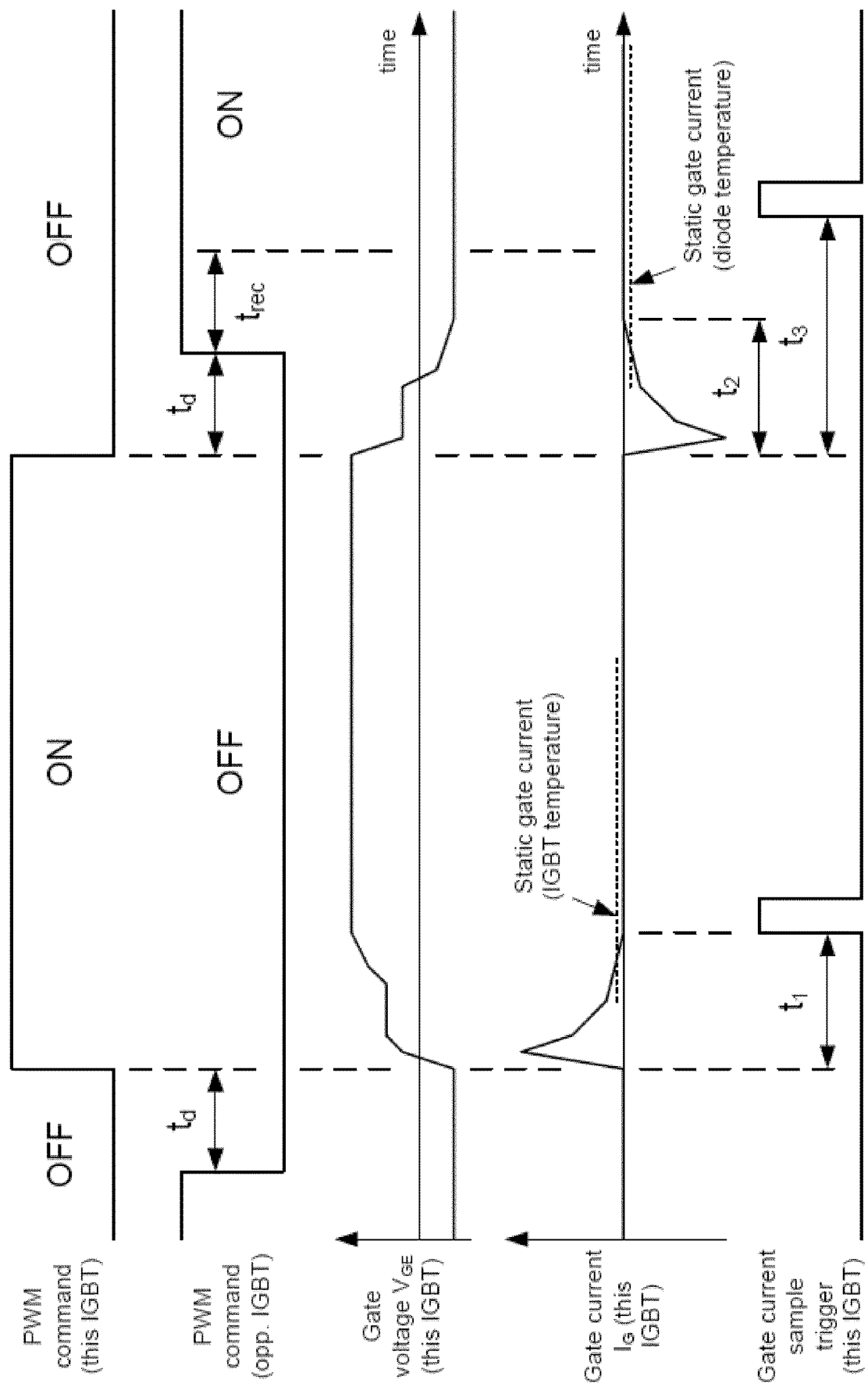
FIG. 14 shows an illustrative summary of example measurement timing for static gate current.

We now turn to consideration of operation of measurement in a gate drive, with regard to FIG. 14 that shows an illustrative summary of example measurement timing for static gate current, wherein: time delay to is the dead time between complementary IGBT1s. $t_1$ and $t_2$ are the time delays to allow gate capacitance charging/discharging to decay after switching. Time delay $t_{rec}$ is the time taken for the freewheel diode to finish switching, in the case that the opposite IGBT is carrying current and commutating with this diode. Time delay $t_3$ is chosen such that it exceeds both t2 and ($t_d$+$t_{rec}$). Any one or more of these time delays may be predetermined, e.g., stored in memory preferably at the drive circuitry of any embodiment. Moreover, any one of more of these delays may be used to determine a time when a power switching device and/or diode is/are in a static state. Thus, such delay(s) may be used to determine when sense signal(s) should be sampled by drive circuitry to determine operational condition(s) such as current and/or temperature of a power switching device and/or diode.

Measurement of the current drawn by the on-chip sensors may be performed in the gate drive by simply using a resistive current shunt in series with the gate, as shown in FIG. 1. It may be advantageous to consider timing of the measurement, to avoid errors arising in an embodiment from capacitive current still flowing at the end of a switching event, and/or to synchronise to the gate voltage steps used to discriminate between currents drawn by the different sensors.

Further regarding the summary of example such timing as shown in FIG. 14, and taking the implementation shown in FIG. 11, either or both of the following timings may apply:

(i) IGBT: the positive gate current representing the IGBT temperature is measured several microseconds (e.g. 5-50 μs) after turn-on command to the gate drive. The time delay may be advantageous to allow capacitive currents from charging up the IGBT gate capacitance to decay sufficiently so as not to cause a less accurate measurement of temperature.

(ii) diode: the negative gate current representing the diode temperature is measured after two time delays: (a) the dead time and (b) a further delay as in (i) to allow the IGBT gate capacitance discharging current to decay. (a) may be advantageous since the opposite IGBT commutating with the freewheel diode—in the case that the freewheel diode is conducting—will generally not turn on until a time delay (dead time) following the anti-parallel IGBT is turned off, and the diode switching when a gate current measurement is made may disrupt the gate current due to capacitive coupling effects. This is shown in FIG. 14.

Regarding other example implementations, we further consider combining the above methods relating to, e.g., integrated on-chip sensors with current outputs, resistive temperature sensor and/or current sensor. In this regard, FIG. 12 shows a general schematic representation of an example circuit at chip level.

Figure 12:
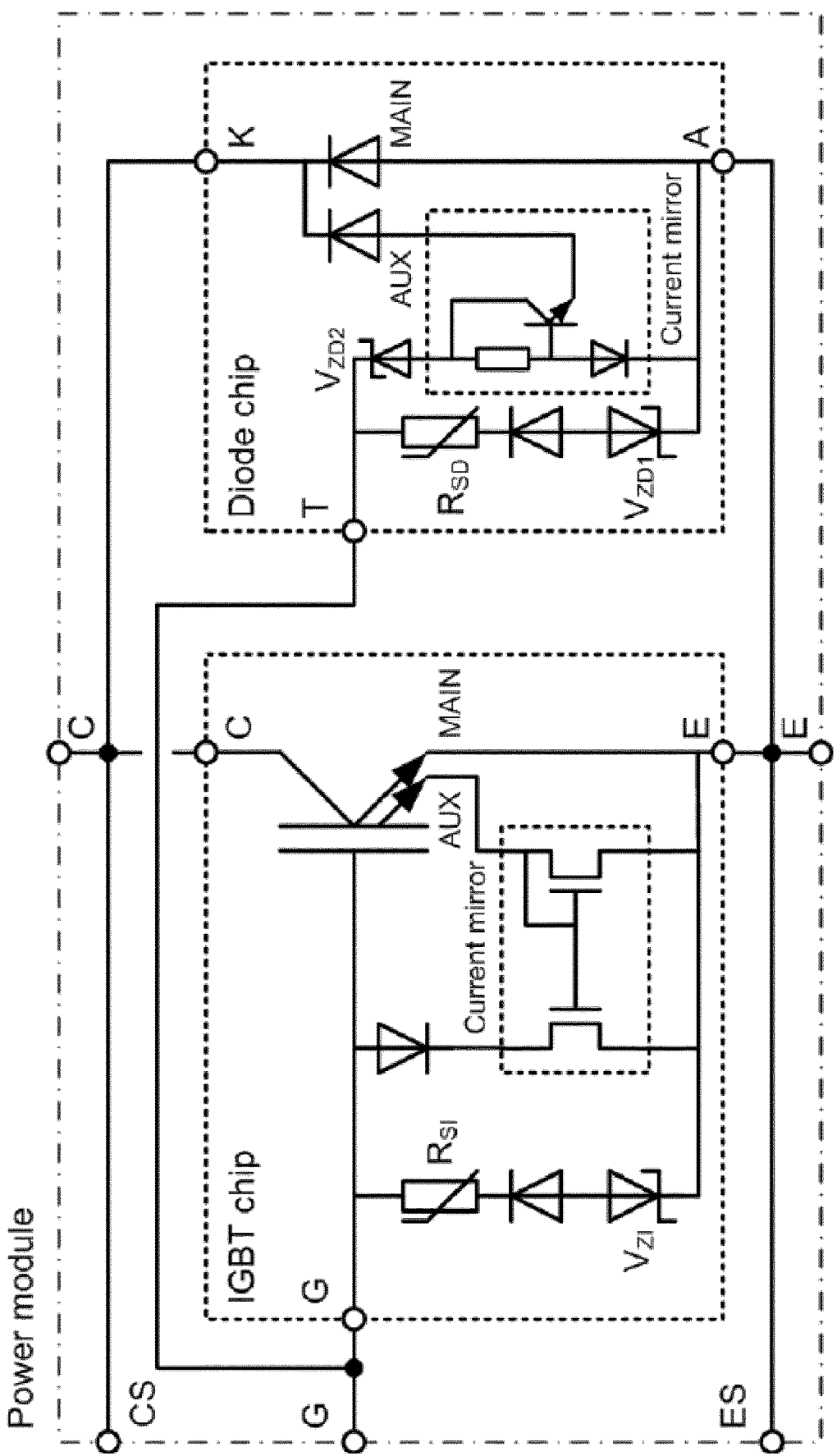
FIG. 12 shows an example combination of methods which may provide current outputs, resistive temperature sensor and/or current sensor.

Up to four current sources, current mirrors and/or resistors may be connected to the gate, e.g., current mirrors and/or resistors as shown in FIG. 12: IGBT temperature sense resistor; IGBT current mirror; diode temperature sense resistor; and/or diode current mirror. Discrimination between the current sources is advantageous in some embodiments if the static current drawn is to be a useful indicator of device operation.

One approach to this is to use series diodes—both zener and conventional—to make the current sources voltage-dependent. In this way, gate voltages not critical for IGBT operation, e.g. VGE>13 V and VGE<−5 V, can be driven during static operation periodically to measure the different combinations of current, without affecting IGBT behaviour.

Figure 13:
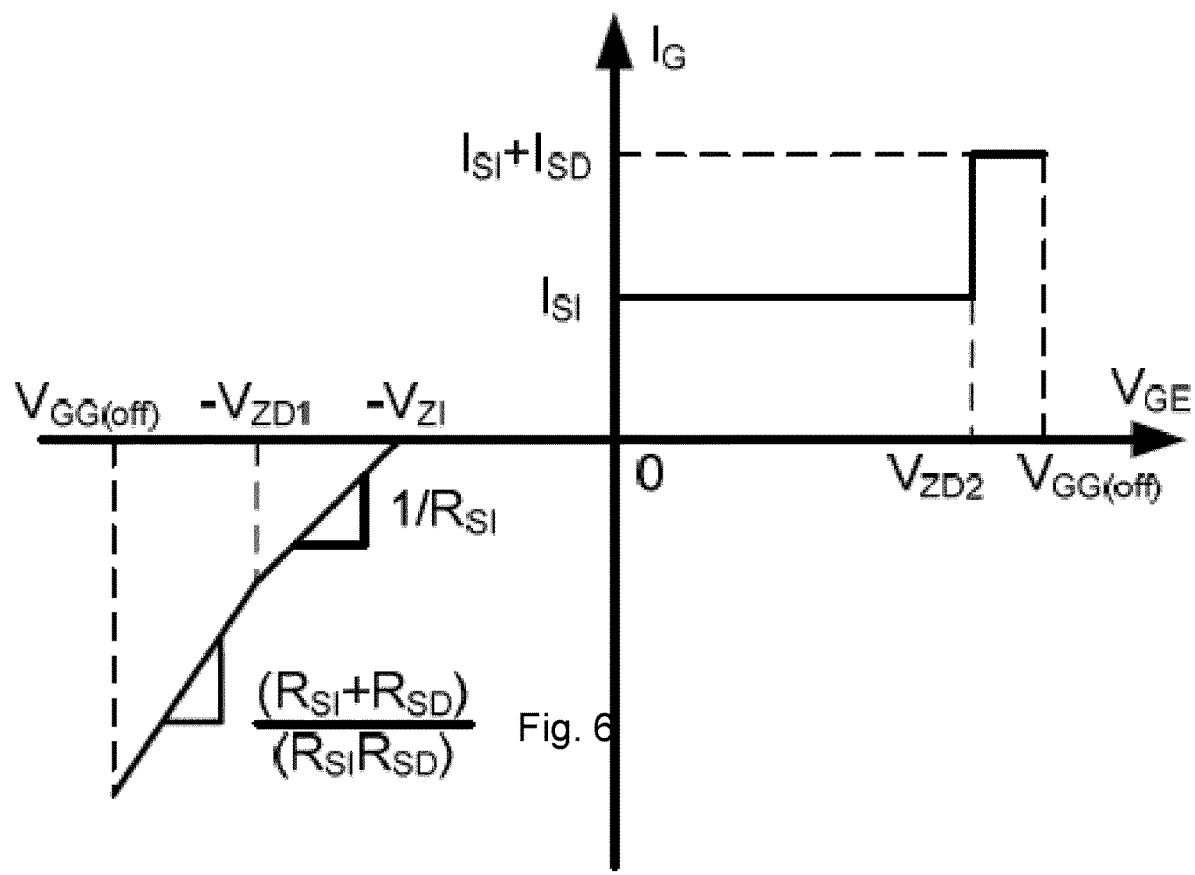
FIG. 13 shows an example of current-voltage dependence used to derive the four measurements for example from the implementation of FIG. 12.

In this regard, FIG. 13 shows an example of current-voltage dependence used to derive the four measurements. In one embodiment the drive input line can be held at different biases to obtain different respective sense signals, e.g., at least one negative bias and/or at least one positive bias such as −10 V, −8 V, +13 V and/or +15 V for diode temperature, diode current, IGBT current, IGBT temperature sense signals (in any order). Thus, multi-level biasing may aid distinguishing of sense signals.

Further in this regard, every device chip in a multi-chip module may be able to utilise the principles and/or embodiments described above. For the on-state current measurements, the total gate current into the module may be simply proportional to the sum of the main chip currents, i.e. proportional to the total module current. For temperature, the total gate current may be proportional to an aggregate of the chip temperatures, i.e. some form of average depending on the sense resistor temperature dependency.

Measurement of the current drawn by the on-chip sensors may be performed (similarly as mentioned above) in the gate drive by simply using a resistive current shunt in series with the gate. It may be advantageous to consider timing of the measurement, to avoid errors arising in an embodiment from capacitive current still flowing at the end of a switching event, and/or to synchronise to the gate voltage steps used to discriminate between currents drawn by the different sensors.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

Merely for assistance, a key to drawing labels is provided below:

1, 1a to 1n: power circuit having at least one power switching device and/or freewheel diode
3: power switching device
5, 5a, 5b: sense circuitry or further sense circuitry
7: drive circuitry
9a, 9b: conduction terminals of a power switching device
13: freewheel diode
15a, 15b: anode and cathode conduction terminals of freewheel diode
19: drive input line
21: device control terminal
23: temperature sensitive current source
25: blocking diode
27: auxiliary emitter terminal of power switching device
29, 31: impedance
33: switch
35: switch control terminal
37: chip including freewheel diode
39: auxiliary conduction terminal
41: temperature sensitive resistor
43: current mirror
49: chip including power switching device
51: multi-chip module
53: module drive circuit

The invention claimed is:

1. A power circuit comprising:
 a power switching device configured to, when in an ON state, conduct current from a first device conduction terminal of the power switching device to a second device conduction terminal of the power switching device;

a freewheel diode coupled in anti-parallel to the power switching device, the freewheel diode being configured to, when in a non-blocking state, conduct current from an anode conduction terminal of the freewheel diode to a cathode conduction terminal of the freewheel diode;

a drive input line coupled to a device control terminal of the power switching device to control switching of the power switching device; and sense circuitry comprising at least one temperature sensitive current source coupled to at least one of conduction terminals, the sense circuitry configured to provide at least one sense signal from the temperature sensitive current source to the drive input line, the sense signal configured to indicate at least one temperature, wherein at least one of:

the temperature sensitive current source is thermally coupled to the power switching device, the temperature indicated by the sense signal is of the power switching device, and the at least one of the conduction terminals comprises the first device conduction terminal or the second device conduction terminal of the power switching device; and the temperature sensitive current source is thermally coupled to the freewheel diode, the temperature indicated by the sense signal is of the freewheel diode, and the at least one of the conduction terminals comprises the anode conduction terminal or the cathode conduction terminal of the freewheel diode, wherein the sense circuitry comprises at least the temperature sensitive current source thermally coupled to the power switching device, wherein the at least one of the conduction terminals comprises an auxiliary emitter terminal of the power switching device, wherein the sense circuitry is for sensing a temperature and an overcurrent, the sense circuitry comprising:

the temperature sensitive current source, coupled in parallel with the device control terminal;

an impedance in series with the auxiliary emitter terminal of the power switching device; and a blocking diode coupled to block current flow from the temperature sensitive current source to the impedance, and configured to allow current flow from the auxiliary emitter terminal to the temperature sensitive current source, and wherein the sense signal received by the drive input line is to indicate current through the temperature sensitive current source, the blocking diode configured to allow the current flow from the auxiliary emitter terminal to increase output current of the current source when a voltage on the impedance exceeds a threshold dependent on a threshold voltage of the blocking diode.

2. The power circuit of claim 1, comprising drive circuitry coupled to provide to the drive input line a drive signal to control the device control terminal of the power switching device to control switching of the power switching device, the drive circuitry configured to determine at least one operational condition of the power circuit based on the sense signal received on the drive input line, wherein the at least one operational condition comprises at least one of:

the indicated temperature of the power switching device when the power switching device is in a static state; and the indicated temperature of the freewheel diode when the power switching device and the freewheel diode are each in a static state.

3. The power circuit of claim 1, wherein the sense circuitry comprises the temperature sensitive current source thermally coupled to the power switching device and the temperature sensitive current source thermally coupled to the freewheel diode and further comprises blocking diodes, the at least one sense signal comprises a current flow of the temperature sensitive current source, and wherein one of the blocking diodes is coupled to block the current flow to the drive input line and a second one of the blocking diodes is coupled to block the current flow from the drive input line.

4. The power circuit of claim 1, the sense circuitry comprising:

a switch having a switch control terminal coupled to the impedance, the switch configured to turn on when current from the auxiliary emitter terminal causes the voltage on the impedance beyond a predetermined voltage, wherein the drive input line is coupled to receive the sense signal dependent on current through the temperature sensitive current source and an overcurrent sense signal dependent on current through the switch.

5. The power circuit of claim 4, wherein the switch is configured to, when on, discharge the device control terminal of the power switching device to reduce the current from the first device conduction terminal to the second device conduction terminal of the power switching device.

6. The power circuit of claim 1, wherein the sense circuitry presents an impedance of 0.5-10 Kilo-Ohms to the at least one of the conduction terminals coupled to the sense circuitry.

7. The power circuit of claim 1, wherein the device control terminal is an electrically insulating gate terminal.

8. The power circuit of claim 1, wherein the power switching device is an IGBT, MOSFET, power JFET or HEMT.

9. The power circuit of claim 1, wherein the power circuit is in a form of a semiconductor chip comprising the power switching device, the sense circuitry and the drive input line each integral to the semiconductor chip.

10. The power circuit of claim 1, comprising a semiconductor chip having the power switching device, wherein the sense circuitry is bonded to a surface of the semiconductor chip.

11. A circuit for driving the power switching device of the power circuit according to claim 1, the drive circuitry having a drive output line configured to be coupled to the device control terminal of the power switching device to control switching of the power switching device, the drive output line further configured to receive the at least one sense signal, the drive circuitry configured to determine at least one operational condition of the power circuit on a basis of the at least one sense signal, wherein the operational condition comprises at least one of:

the current from the first device conduction terminal of the power switching device to a second device conduction terminal of the power switching device when the power switching device is in a static state;

the temperature of the freewheel diode coupled in anti-parallel to the power switching device when the power switching device and the freewheel diode are each in the static state; and the current from the anode of the freewheel diode to the cathode of the freewheel diode, the freewheel diode coupled in anti-parallel to the power switching device, when the power switching device and the freewheel diode are each in the static state.

12. The power circuit comprising the drive circuitry of claim 11 and further comprising at least one of the power switching device and the freewheel diode.

13. A power circuit comprising:
a freewheel diode configured to, when in a non-blocking state, conduct current from an anode conduction terminal of the freewheel diode to a cathode conduction terminal of the freewheel diode;
sense circuitry coupled to a conduction terminal of the freewheel diode, the sense circuitry configured to provide a sense signal dependent on a voltage and/or on a current on the coupled conduction terminal of the freewheel diode; and
a drive circuit coupled to provide to a drive input line a drive signal to control a device control terminal of a power switching device to control switching of the power switching device, the drive circuitry configured to determine at least one operational condition of the freewheel diode based on the sense signal received on the drive input line from the sense circuitry when the power switching device and the freewheel diode are each in a static state.

14. The power circuit of claim 13, comprising:
the power switching device configured to, when in an ON state, conduct current from a first device conduction terminal of the power switching device to a second device conduction terminal of the power switching device, wherein the freewheel diode is coupled in anti-parallel to the power switching device; and
the drive input line coupled to the device control terminal of the power switching device to control switching of the power switching device, the drive input line further configured to receive the sense signal.

15. The power circuit of claim 14, comprising:
further sense circuitry coupled to the device conduction terminal of the power switching device, the further sense circuitry configured to provide to the drive input line a further sense signal to indicate an operational condition of the power switching device, wherein the further sense circuitry and the sense circuitry coupled to the freewheel diode each comprise a blocking diode, each of the sense signal and the further sense signal comprises a current flow, and wherein one of the blocking diodes is coupled to block the current flow to the drive input line and the other of the blocking diodes is coupled to block the current flow from the drive input line.

16. The power circuit of claim 13, wherein the at least one operational condition comprises at least one of:
a temperature of the freewheel diode when the power switching device and the freewheel diode are each in the static state, wherein the sense circuitry is thermally coupled to the freewheel diode; and
a value of a current from the anode conduction terminal of the freewheel diode to the cathode conduction terminal of the freewheel diode when the power switching device and the freewheel diode are each in the static state.

17. The power circuit of claim 13, comprising a chip comprising the freewheel diode, wherein:
the chip has an auxiliary conduction terminal that is an external terminal of the chip and the freewheel diode conduction terminal coupled to the sense circuitry is the auxiliary conduction terminal.

18. The power circuit of claim 13, wherein the sense circuitry comprises a temperature sensitive resistor, and wherein the sense signal comprises a current through the temperature sensitive resistor.

19. The power circuit of claim 13, wherein:
the sense circuitry comprises a current mirror configured to mirror current through the freewheel diode, the sense signal dependent on a current through the current mirror.

20. The power circuit of claim 13, wherein the sense circuitry comprises a temperature sensitive current source coupled to the conduction terminal of the freewheel diode, the sense signal dependent on a current through the temperature sensitive current source.

21. A power circuit comprising:
a power switching device configured to, when in an ON state, conduct current from a first device conduction terminal of the power switching device to a second device conduction terminal of the power switching device;
sense circuitry coupled to a device conduction terminal of the power switching device, the sense circuitry configured to provide a sense signal to indicate the current from the first device conduction terminal to the second device conduction terminal;
a drive input line coupled to a device control terminal of the power switching device to control switching of the power switching device, the drive input line further configured to receive the sense signal,
a freewheel diode coupled in anti-parallel to the power switching device, the freewheel diode to, when in a non-blocking state, conduct current from an anode conduction terminal of the freewheel diode to a cathode conduction terminal of the freewheel diode; and
further sense circuitry configured to couple to a conduction terminal of the freewheel diode, the further sense circuitry to provide a further sense signal dependent on a voltage on the coupled conduction terminal of the freewheel diode,
wherein the drive input line is configured to receive the further sense signal from the further sense circuitry, and
wherein the sense circuitry configured to couple to a device conduction terminal of the power switching device and the further sense circuitry each comprise a blocking diode, each of the sense signal and the further sense signal comprises a current flow, and wherein one of the blocking diodes is coupled to block a current flow to the drive input line and the other of the blocking diodes is coupled to block a current flow from the drive input line.

22. The power circuit of claim 21, comprising drive circuitry coupled to provide to the drive input line a drive signal to control the device control terminal of the power switching device to control switching of the power switching device, the drive circuitry configured to determine at least one operational condition of the power circuit based on the sense signal received on the drive input line when the power switching device is in a static state.

23. The power circuit of claim 22, wherein the operational condition comprises a value of the current from the first device conduction terminal of the power switching device to the second device conduction terminal of the power switching device when the power switching device is in the static state.

24. The power circuit of claim 21, wherein the first device conduction terminal or the second device conduction terminal is an emitter terminal and the power switching device has an auxiliary emitter terminal, wherein:
the device conduction terminal coupled to the sense circuitry is the auxiliary emitter terminal; and
the sense circuitry comprises a current mirror coupled to mirror a current from the auxiliary emitter terminal, the sense circuitry configured to generate the sense signal dependent on the current through the current mirror.

25. The power circuit of claim 21, wherein the drive circuitry is configured to determine at least one operational condition of the power circuit based on the further sense signal received on the drive input line from the further sense circuitry when the power switching device and the freewheel diode are each in a static state.

26. The power circuit of claim 21, wherein the current indication by the sense signal indicates an overcurrent condition of the power switching device, wherein the sense circuitry comprises:
an impedance in series with an auxiliary emitter terminal of the power switching device; and
a switch having a switch control terminal coupled to the impedance, the switch configured to turn on when current from the auxiliary emitter terminal causes a voltage on the impedance beyond a threshold voltage,
wherein the drive input line is coupled to receive the sense signal dependent on current through the switch.

27. A multi-chip module, the multi-chip module comprising at least one of a power circuit comprising:
a power switching device configured to, when in an ON state, conduct current from a first device conduction terminal of the power switching device to a second device conduction terminal of the power switching device;
a freewheel diode coupled in anti-parallel to the power switching device, the freewheel diode being configured to, when in a non-blocking state, conduct current from an anode conduction terminal of the freewheel diode to a cathode conduction terminal of the freewheel diode;
a drive input line coupled to a device control terminal of the power switching device to control switching of the power switching device; and
sense circuitry comprising at least one temperature sensitive current source coupled to at least one of conduction terminals, the sense circuitry configured to provide at least one sense signal from the temperature sensitive current source to the drive input line, the sense signal configured to indicate at least one temperature,
wherein at least one of:
the temperature sensitive current source is thermally coupled to the power switching device, the temperature indicated by the sense signal is of the power switching device, and the at least one of the conduction terminals comprises the first device conduction terminal or the second device conduction terminal of the power switching device; and
the temperature sensitive current source is thermally coupled to the freewheel diode, the temperature indicated by the sense signal is of the freewheel diode, and the at least one of the conduction terminals comprises the anode conduction terminal or the cathode conduction terminal of the freewheel diode,
and
the multi-chip module further comprising:
a plurality of semiconductor chips each having the power switching device of a respective one of the at least one of the power circuit; and
a module drive circuit configured to control switching of the power switching device of each of the at least one of the power circuit by controlling device control terminals of the respective power switching device, the module drive circuit comprising drive circuitry of each the at least one of the power circuit,
wherein the module drive circuit is configured to receive the sense signal from the drive input line of each of the at least one of the power circuit and to determine at least one operational condition of the multi-chip module based on the received sense signal.

28. The multi-chip module of claim 27, wherein the module drive circuit is configured to receive a further sense signal from further sense circuitry, the module drive circuit to determine the at least one operational condition based on the sense signal received on the drive input line from each of the least one of the power circuit having the freewheel diode.

* * * * *